(12) United States Patent
Ebe et al.

(10) Patent No.: US 9,082,940 B2
(45) Date of Patent: Jul. 14, 2015

(54) ENCAPSULATING LAYER-COVERED SEMICONDUCTOR ELEMENT, PRODUCING METHOD THEREOF, AND SEMICONDUCTOR DEVICE

(71) Applicant: NITTO DENKO CORPORATION, Ibaraki-shi, Osaka (JP)

(72) Inventors: Yuki Ebe, Osaka (JP); Hiroyuki Katayama, Osaka (JP); Ryuichi Kimura, Osaka (JP); Hidenori Onishi, Osaka (JP); Kazuhiro Fuke, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 34 days.

(21) Appl. No.: 13/914,158

(22) Filed: Jun. 10, 2013

(65) Prior Publication Data
US 2014/0001656 A1   Jan. 2, 2014

(30) Foreign Application Priority Data

Jun. 29, 2012 (JP) ................. 2012-147553
Jan. 30, 2013 (JP) ................. 2013-015782

(51) Int. Cl.
| | |
|---|---|
| H01L 33/50 | (2010.01) |
| H01L 33/56 | (2010.01) |
| H01L 33/52 | (2010.01) |
| H01L 21/56 | (2006.01) |
| H01L 23/28 | (2006.01) |
| H01L 33/00 | (2010.01) |

(52) U.S. Cl.
CPC ............ *H01L 33/501* (2013.01); *H01L 21/568* (2013.01); *H01L 23/28* (2013.01); *H01L 33/52* (2013.01); *H01L 33/56* (2013.01); *H01L 33/0095* (2013.01); *H01L 2924/0002* (2013.01); *H01L 2933/005* (2013.01)

(58) Field of Classification Search
CPC ...................................................... H01L 33/501
See application file for complete search history.

(56) References Cited

U.S. PATENT DOCUMENTS

| | | | |
|---|---|---|---|
| 2002/0011655 A1 | 1/2002 | Nishiyama et al. | |
| 2003/0092252 A1 | 5/2003 | Nishiyama et al. | |
| 2005/0215033 A1 | 9/2005 | Yamamoto et al. | |
| 2010/0304546 A1* | 12/2010 | Ogawa et al. | 438/401 |
| 2011/0251305 A1* | 10/2011 | Ueno et al. | 523/429 |
| 2012/0217527 A1* | 8/2012 | Ito et al. | 257/98 |
| 2012/0262054 A1* | 10/2012 | Ooyabu et al. | 313/498 |

FOREIGN PATENT DOCUMENTS

| | | |
|---|---|---|
| JP | 2001-308116 A | 11/2001 |
| JP | 2005-286003 A | 10/2005 |
| JP | 2012-039013 A | 2/2012 |

* cited by examiner

*Primary Examiner* — Daniel Luke
(74) *Attorney, Agent, or Firm* — Sughrue Mion, PLLC

(57) ABSTRACT

A method for producing an encapsulating layer-covered semiconductor element includes the steps of preparing a support sheet including a hard support board; disposing a semiconductor element at one side in a thickness direction of the support sheet; disposing an encapsulating layer formed from an encapsulating resin composition containing a curable resin at the one side in the thickness direction of the support sheet so as to cover the semiconductor element; curing the encapsulating layer to encapsulate the semiconductor element by the encapsulating layer that is flexible; cutting the encapsulating layer that is flexible corresponding to the semiconductor element to produce an encapsulating layer-covered semiconductor element; and peeling the encapsulating layer-covered semiconductor element from the support sheet.

12 Claims, 15 Drawing Sheets

FIG.4
FIG.4(a)
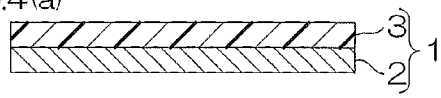
FIG.4(b)
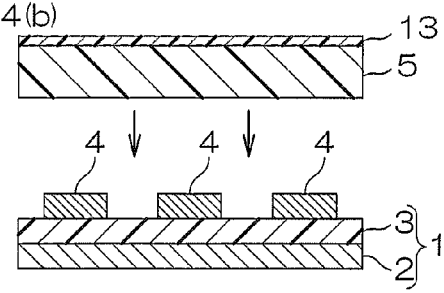
FIG.4(c)
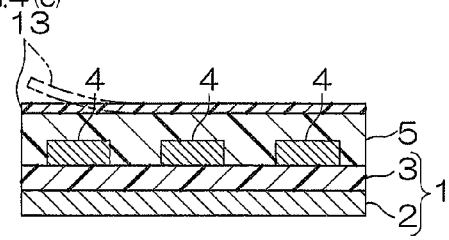
FIG.4(d)
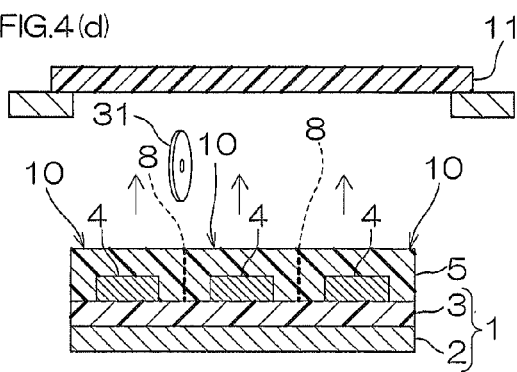
FIG.4(e)
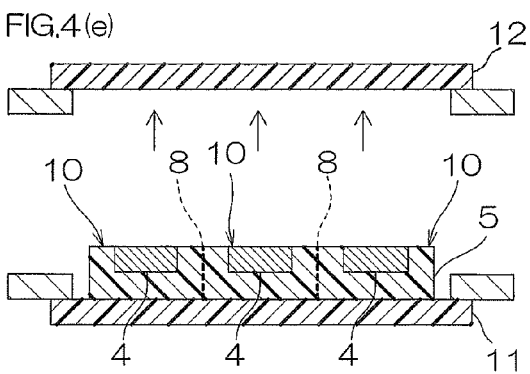
FIG.4(f)
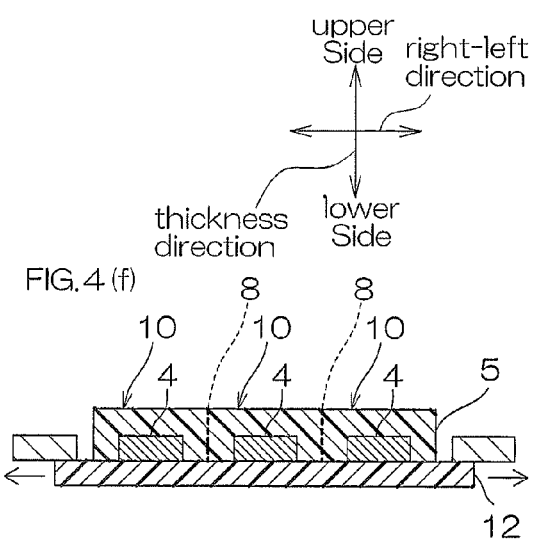
FIG.4(g)
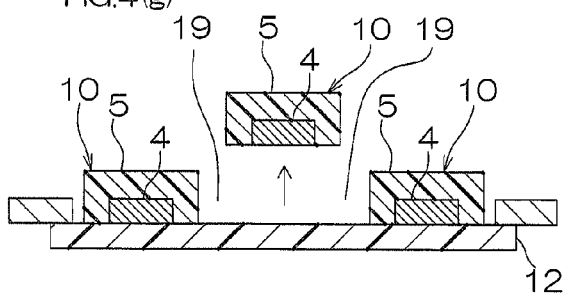
FIG.4(g')
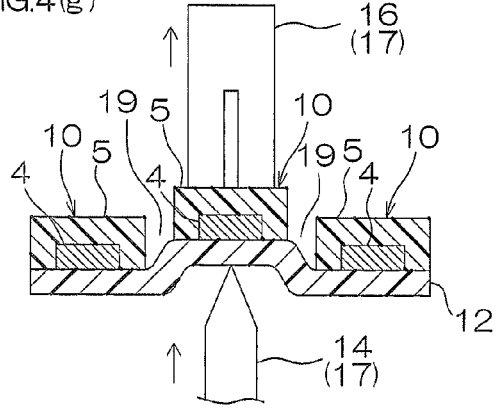
FIG.4(h)
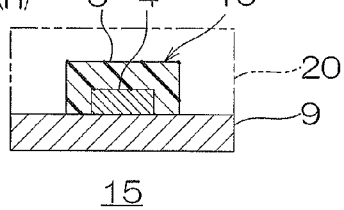

FIG.8
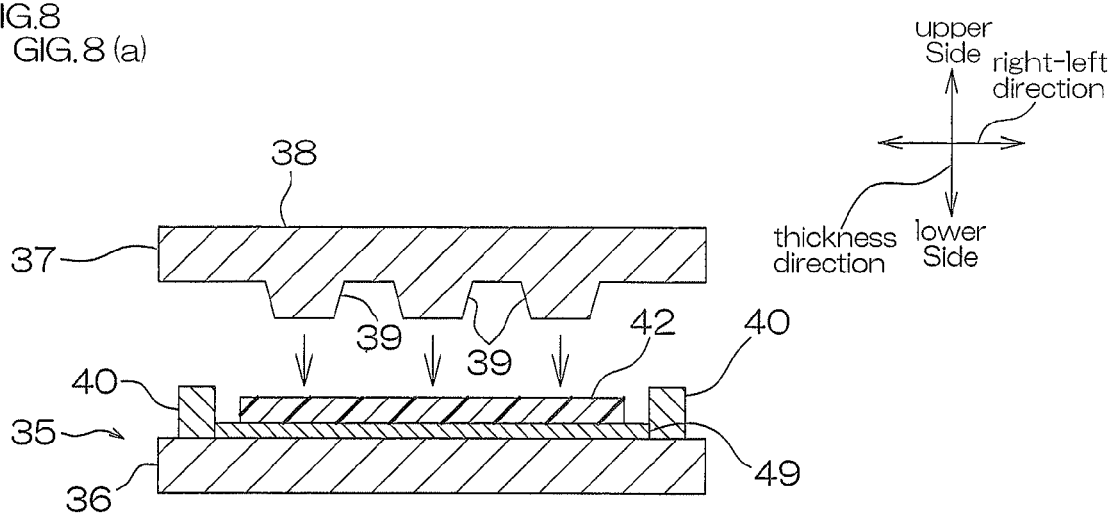
FIG.8(a)
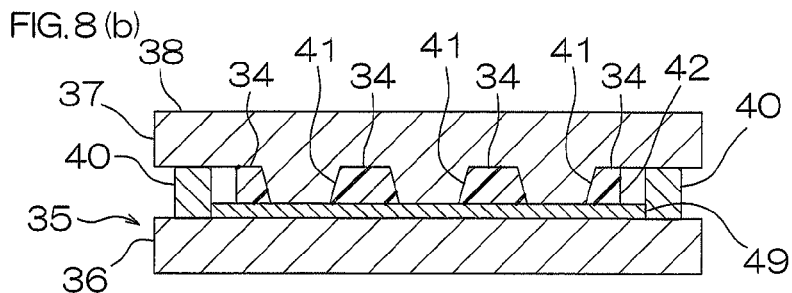
FIG.8(b)
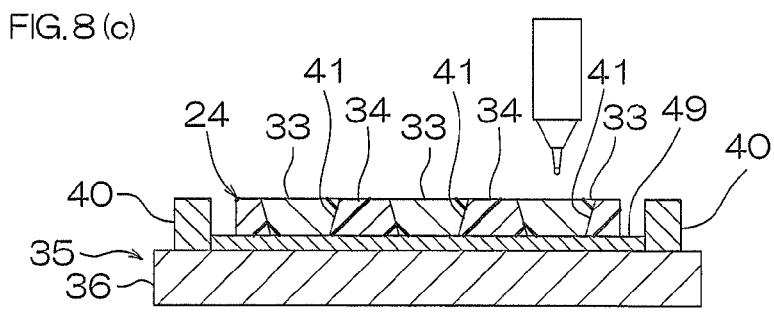
FIG.8(c)
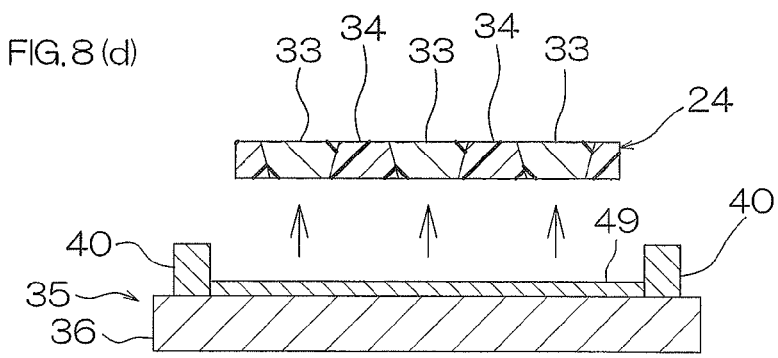
FIG.8(d)

FIG. 9
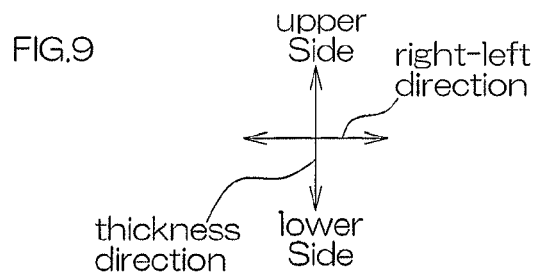
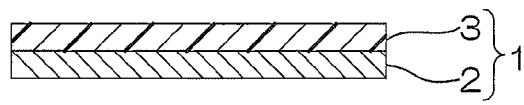
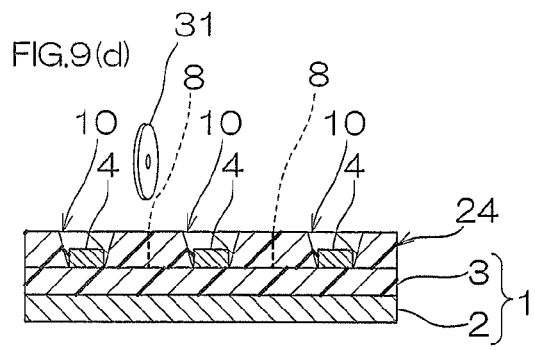
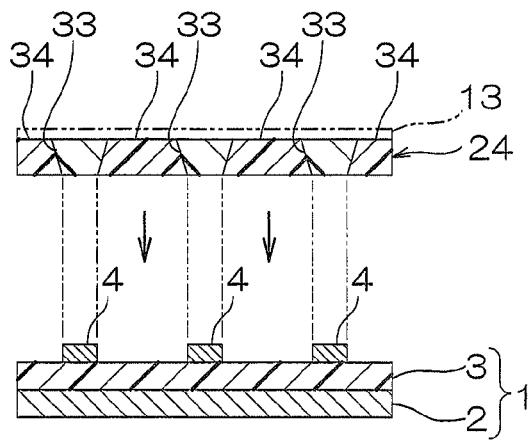
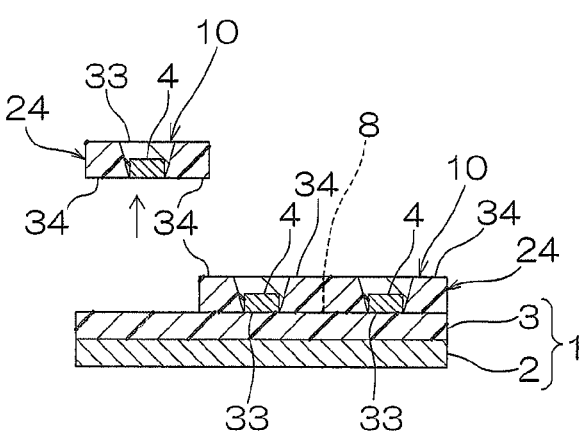
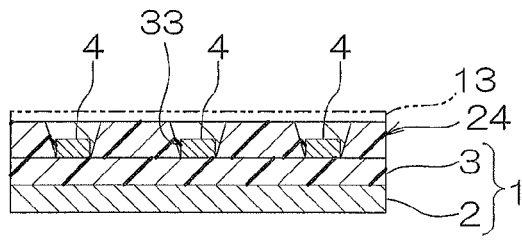
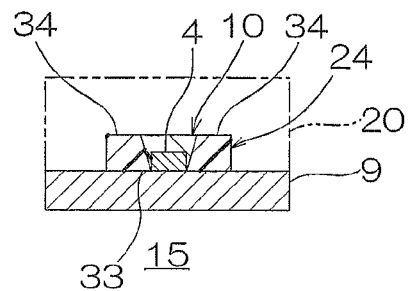

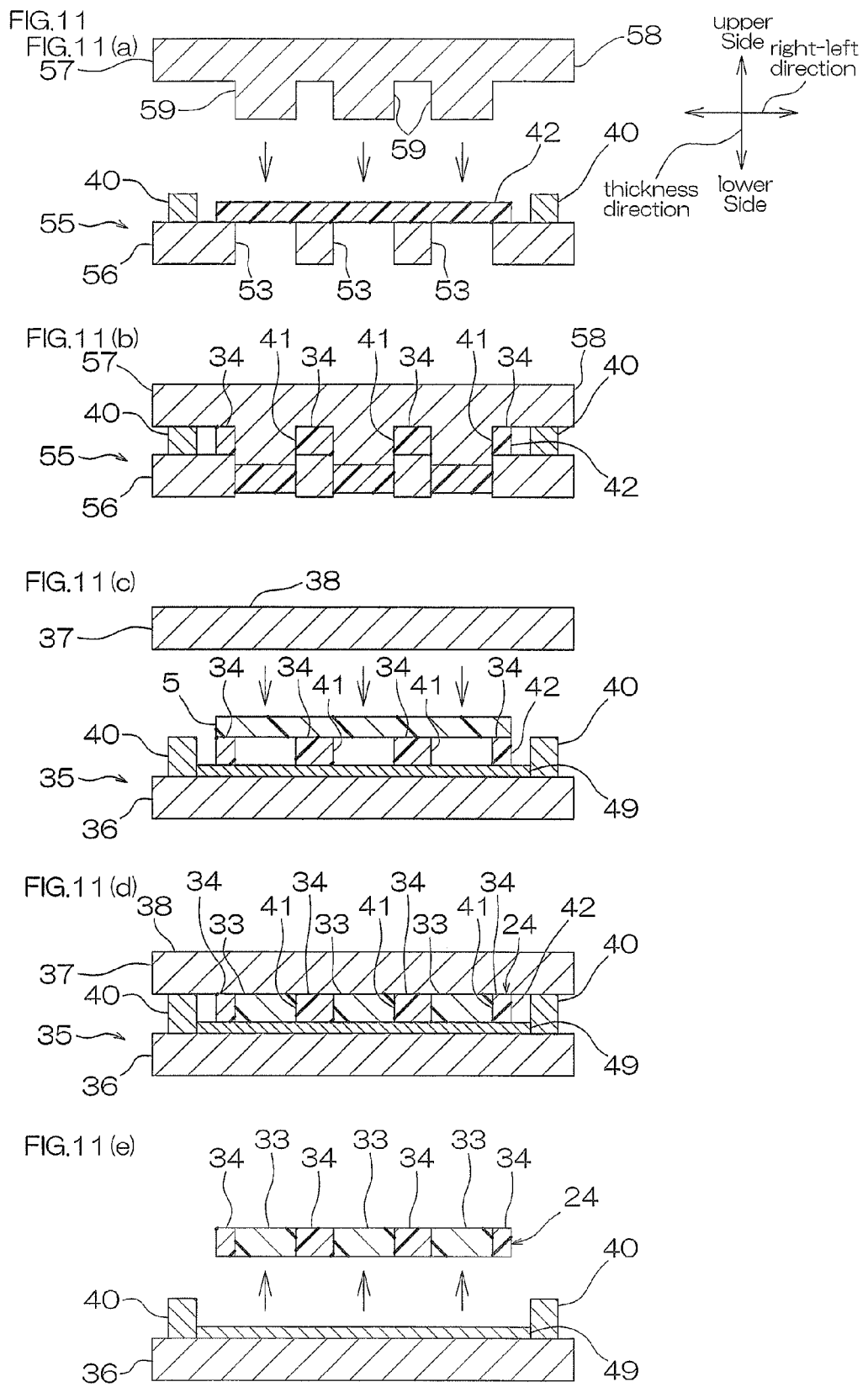

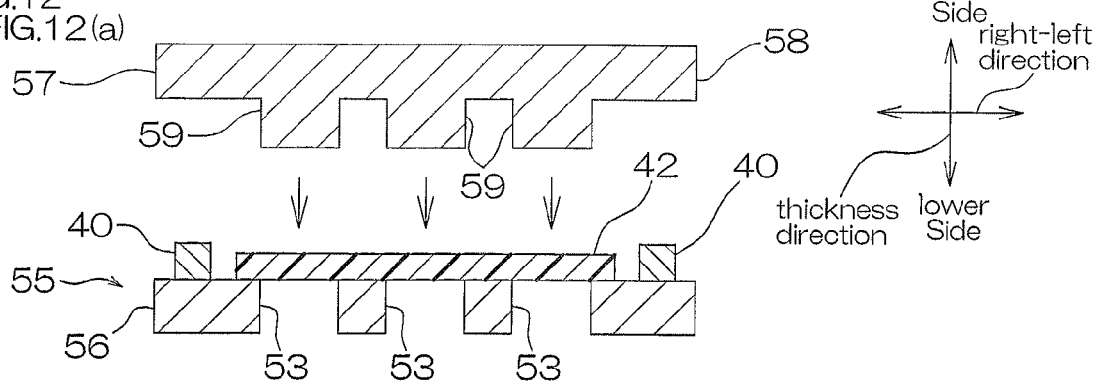
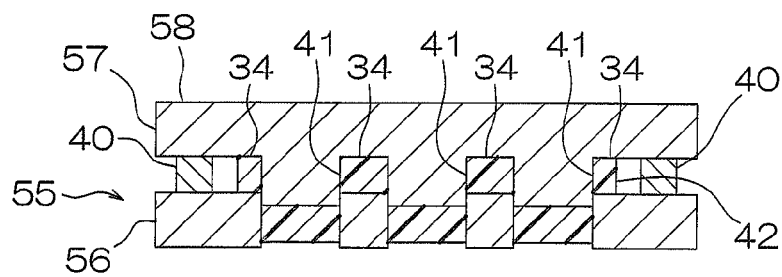
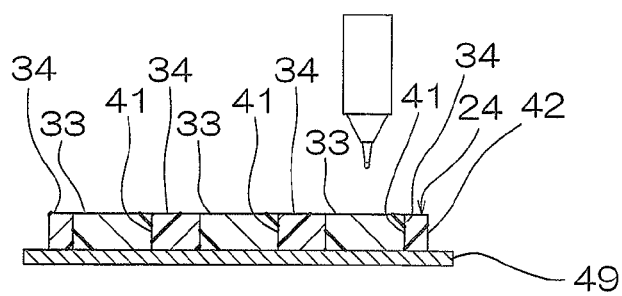
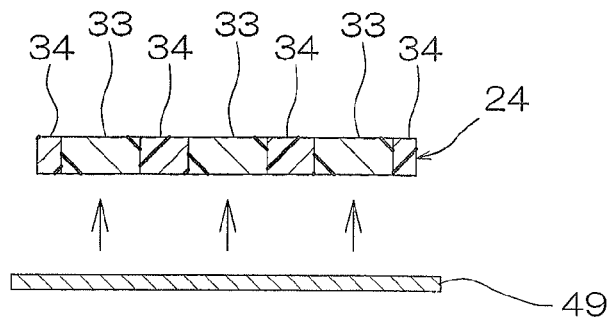

FIG.13
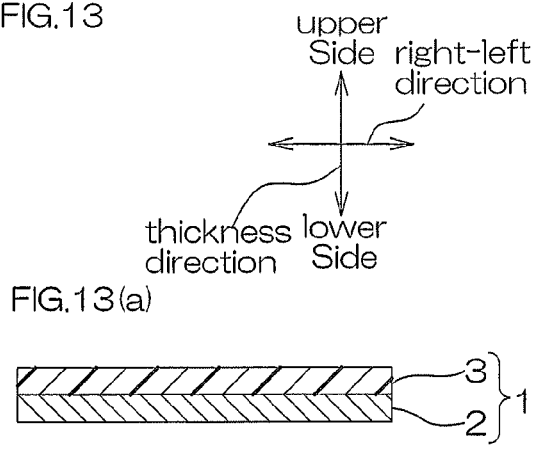
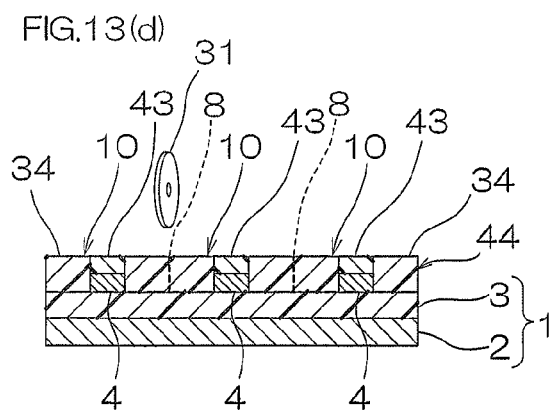
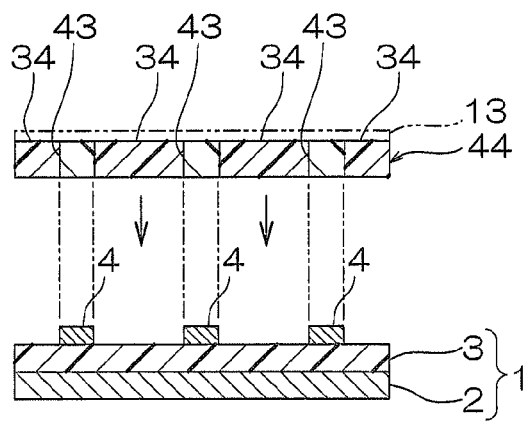
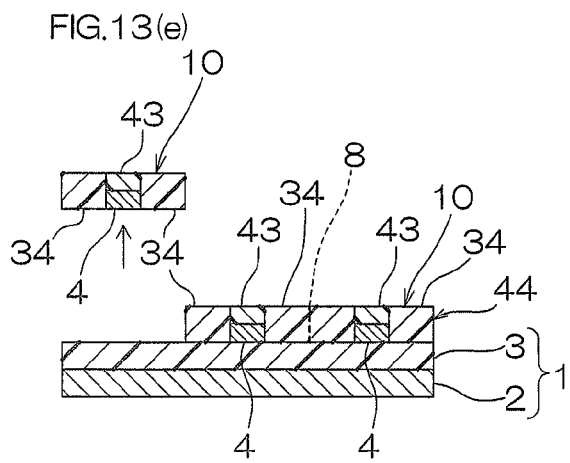
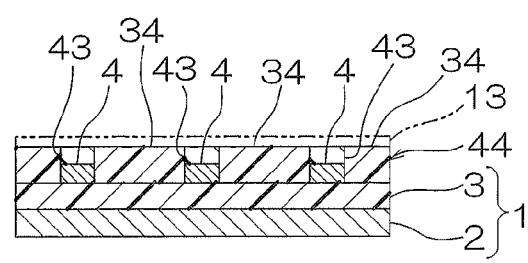

FIG.14
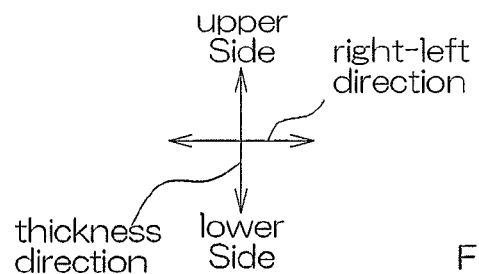
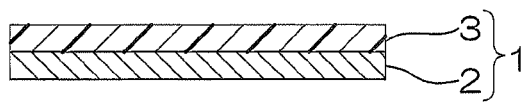
FIG.14(a)
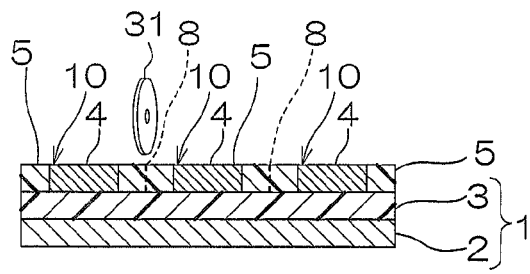
FIG.14(d)
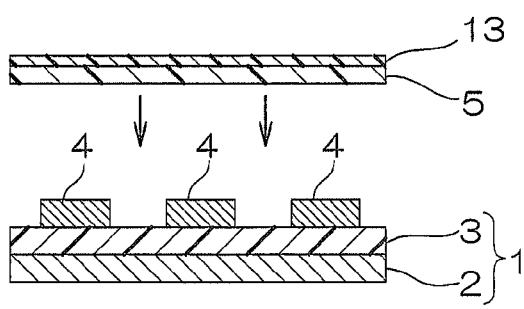
FIG.14(b)
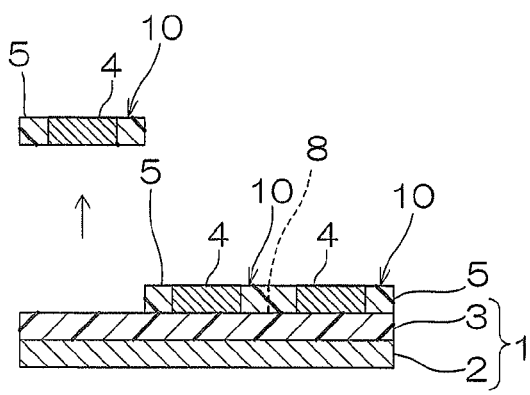
FIG.14(e)
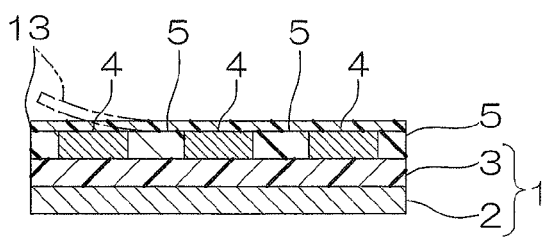
FIG.14(c)
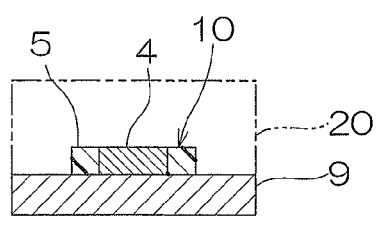
FIG.14(f)

ENCAPSULATING LAYER-COVERED SEMICONDUCTOR ELEMENT, PRODUCING METHOD THEREOF, AND SEMICONDUCTOR DEVICE

CROSS-REFERENCE TO RELATED APPLICATION

The present application claims priority from Japanese Patent Applications No. 2012-147553 filed on Jun. 29, 2012 and No. 2013-015782 filed on Jan. 30, 2013, the contents of which are hereby incorporated by reference into this application.

BACKGROUND OF THE INVENTION

1. Field of the Invention

The present invention relates to an encapsulating layer-covered semiconductor element, a producing method thereof, and a semiconductor device, to be specific, to a method for producing an encapsulating layer-covered semiconductor element, an encapsulating layer-covered semiconductor element obtained by the method, and a semiconductor device including the encapsulating layer-covered semiconductor element.

2. Description of Related Art

It has been known that, conventionally, a semiconductor device including a light emitting diode device (hereinafter, abbreviated as an LED device), an electronic device, or the like is produced as follows: first, a plurality of semiconductor elements (including light emitting diode elements (hereinafter, abbreviated as LEDs), electronic elements, or the like) are mounted on a board; next, an encapsulating layer is provided so as to cover a plurality of the semiconductor elements; and thereafter, the resulting products are singulated into individual semiconductor elements.

Among all, when the semiconductor element is an LED and the semiconductor device is an LED device, unevenness in emission wavelength and luminous efficiency is generated between a plurality of the LEDs, so that in such an LED device mounted with the LED, there is a disadvantage that unevenness in light emission is generated between a plurality of the LEDs.

In order to solve such a disadvantage, it has been considered that, for example, a plurality of LEDs are covered with a phosphor layer to fabricate a plurality of phosphor layer-covered LEDs and thereafter, the phosphor layer-covered LED is selected in accordance with the emission wavelength and the luminous efficiency to be then mounted on a board.

For example, a chip component obtained by the following method has been proposed (ref: for example, Japanese Unexamined Patent Publication No. 2001-308116). In the method, a chip is attached onto a silica glass substrate via a pressure-sensitive adhesive sheet; next, a resin is applied onto the chip to fabricate dummy wafers made of the chips covered with the resin; thereafter, the dummy wafers are peeled from the silica glass substrate and the pressure-sensitive adhesive sheet; and then, the obtained dummy wafers are subjected to dicing on a chip basis to be singulated so as to produce the chip component. The chip component in Japanese Unexamined Patent Publication No. 2001-308116 is to be then mounted on a board, so that a semiconductor device can be obtained.

Also, an LED obtained by the following method has been proposed (ref: for example, Japanese Unexamined Patent Publication No. 2012-39013). In the method, an LED is disposed on a pressure-sensitive adhesive sheet; next, a ceramic ink in which a phosphor is dispersed and mixed is applied thereto to be heated, so that the ceramic ink is temporarily cured; thereafter, the ceramic ink is subjected to dicing corresponding to the LED; and then, the obtained ceramic ink is fully cured to be vitrified so as to produce the LED. The LED in Japanese Unexamined Patent Publication No. 2012-39013 is to be then mounted on a board, so that an LED device is obtained.

SUMMARY OF THE INVENTION

In the method described in Japanese Unexamined Patent Publication No. 2001-308116, however, when the dummy wafers are subjected to dicing, the dummy wafers are already peeled from the silica glass substrate and the pressure-sensitive adhesive sheet, so that the dummy wafers are not supported by them. Thus, the dummy wafers are not capable of being subjected to dicing with excellent accuracy and as a result, there is a disadvantage that size stability of the chip component to be obtained is low.

On the other hand, in the method described in Japanese Unexamined Patent Publication No. 2012-39013, the ceramic ink is fully cured after being subjected to dicing, so that after the dicing, in the ceramic ink, a dimensional deviation caused by shrinkage that occurs in full curing is generated and therefore, there is a disadvantage that size stability of the LED to be obtained is low.

It is an object of the present invention to provide a method for producing an encapsulating layer-covered semiconductor element in which an encapsulating layer-covered semiconductor element is capable of being obtained with excellent size stability, an encapsulating layer-covered semiconductor element obtained by the method, and a semiconductor device including the encapsulating layer-covered semiconductor element.

A method for producing an encapsulating layer-covered semiconductor element of the present invention includes a preparing step of preparing a support sheet including a hard support board; a semiconductor element disposing step of disposing a semiconductor element at one side in a thickness direction of the support sheet; a layer disposing step of, after the semiconductor element disposing step, disposing an encapsulating layer formed from an encapsulating resin composition containing a curable resin at the one side in the thickness direction of the support sheet so as to cover the semiconductor element; an encapsulating step of curing the encapsulating layer to encapsulate the semiconductor element by the encapsulating layer that is flexible; a cutting step of, after the encapsulating step, cutting the encapsulating layer that is flexible corresponding to the semiconductor element to produce an encapsulating layer-covered semiconductor element including the semiconductor element and the encapsulating layer covering the semiconductor element; and a semiconductor element peeling step of after the cutting step, peeling the encapsulating layer-covered semiconductor element from the support sheet.

In the method for producing an encapsulating layer-covered semiconductor element of the present invention, it is preferable that the encapsulating layer is formed of an encapsulating sheet.

In the method for producing an encapsulating layer-covered semiconductor element of the present invention, it is preferable that in the layer disposing step, the semiconductor element is covered with the encapsulating layer that is in a B-stage state and in the encapsulating step, the encapsulating layer is cured to be brought into a C-stage state and the semiconductor element is encapsulated by the encapsulating layer in a C-stage state.

In the method for producing an encapsulating layer-covered semiconductor element of the present invention, it is preferable that the support sheet further includes a pressure-sensitive adhesive layer that is laminated at one surface in the thickness direction of the support board.

In the method for producing an encapsulating layer-covered semiconductor element of the present invention, it is preferable that in the semiconductor element peeling step, the encapsulating layer-covered semiconductor element is peeled from the support board and the pressure-sensitive adhesive layer.

In the method for producing an encapsulating layer-covered semiconductor element of the present invention, it is preferable that after the cutting step and before the semiconductor element peeling step, a support board peeling step in which the support board is peeled from the pressure-sensitive adhesive layer is further included and in the semiconductor element peeling step, the encapsulating layer-covered semiconductor element is peeled from the pressure-sensitive adhesive layer.

In the method for producing an encapsulating layer-covered semiconductor element of the present invention, it is preferable that the semiconductor element peeling step includes the steps of transferring the encapsulating layer-covered semiconductor element to a stretchable support sheet that is capable of stretching in a direction perpendicular to the thickness direction and peeling the encapsulating layer-covered semiconductor element from the stretchable support sheet, while stretching the stretchable support sheet in the direction perpendicular to the thickness direction.

In the method for producing an encapsulating layer-covered semiconductor element of the present invention, it is preferable that in the preparing step, the support sheet is prepared so that a reference mark, which serves as a reference of cutting in the cutting step, is provided in advance.

In the method for producing an encapsulating layer-covered semiconductor element of the present invention, it is preferable that the semiconductor element is an LED and the encapsulating layer is a phosphor layer.

In the method for producing an encapsulating layer-covered semiconductor element of the present invention, it is preferable that the encapsulating layer includes a cover portion that covers the semiconductor element and a reflector portion that contains a light reflecting component and is formed so as to surround the cover portion.

An encapsulating layer-covered semiconductor element of the present invention is obtained by a method for producing an encapsulating layer-covered semiconductor element including a preparing step of preparing a support sheet including a hard support board; a semiconductor element disposing step of disposing a semiconductor element at one side in a thickness direction of the support sheet; a layer disposing step of, after the semiconductor element disposing step, disposing an encapsulating layer formed from an encapsulating resin composition containing a curable resin at the one side in the thickness direction of the support sheet so as to cover the semiconductor element; an encapsulating step of curing the encapsulating layer to encapsulate the semiconductor element by the encapsulating layer that is flexible; a cutting step of, after the encapsulating step, cutting the encapsulating layer that is flexible corresponding to the semiconductor element to produce an encapsulating layer-covered semiconductor element including the semiconductor element and the encapsulating layer covering the semiconductor element; and a semiconductor element peeling step of, after the cutting step, peeling the encapsulating layer-covered semiconductor element from the support sheet.

A semiconductor device of the present invention includes a board and an encapsulating layer-covered semiconductor element mounted on the board, wherein the encapsulating layer-covered semiconductor element is obtained by a method for producing an encapsulating layer-covered semiconductor element including a preparing step of preparing a support sheet including a hard support board; a semiconductor element disposing step of disposing a semiconductor element at one side in a thickness direction of the support sheet; a layer disposing step of, after the semiconductor element disposing step, disposing an encapsulating layer formed from an encapsulating resin composition containing a curable resin at the one side in the thickness direction of the support sheet so as to cover the semiconductor element; an encapsulating step of curing the encapsulating layer to encapsulate the semiconductor element by the encapsulating layer that is flexible; a cutting step of, after the encapsulating step, cutting the encapsulating layer that is flexible corresponding to the semiconductor element to produce an encapsulating layer-covered semiconductor element including the semiconductor element and the encapsulating layer covering the semiconductor element; and a semiconductor element peeling step of, after the cutting step, peeling the encapsulating layer-covered semiconductor element from the support sheet.

In the method for producing an encapsulating layer-covered semiconductor element of the present invention, after the cutting step, the encapsulating layer-covered semiconductor element is peeled from the support sheet. That is, in the cutting step, the encapsulating layer is capable of being cut, while the semiconductor element and the encapsulating layer are supported by the support sheet including the hard support board. Thus, the encapsulating layer-covered semiconductor element having excellent size stability can be obtained.

After the encapsulating step in which the encapsulating layer is cured, the cutting step in which the encapsulating layer is cut is performed, so that a dimensional deviation caused by shrinkage of the encapsulating layer that may occur in the curing can be cancelled in the cutting step. Thus, the encapsulating layer-covered semiconductor element having further excellent size stability can be obtained.

In addition, the encapsulating layer that encapsulates the semiconductor element is flexible, so that in the cutting step, the encapsulating layer is capable of being smoothly cut not only using an expensive dicing device, but also using various cutting devices.

Consequently, the encapsulating layer-covered semiconductor element of the present invention has excellent size stability.

Also, the semiconductor device of the present invention includes the encapsulating layer-covered semiconductor element having excellent size stability, so that it has excellent reliability.

BRIEF DESCRIPTION OF THE DRAWINGS

FIG. 1 (a) illustrating a step of preparing a support sheet (a preparing step),

FIG. 1 (b) illustrating a step of disposing LEDs on the support sheet (an LED disposing step), FIG. 1 (c) illustrating a step of disposing a phosphor sheet on the support sheet (a sheet disposing step), FIG. 1 (d) illustrating a step of encapsulating the LEDs by the phosphor sheet (an encapsulating step) and a step of cutting the phosphor sheet (a cutting step), FIG. 1 (e) illustrating a step of peeling phosphor sheet-covered LEDs from the support sheet (an LED peeling step), and FIG. 1 (f) illustrating a step of mounting the phosphor sheet-covered LED on a board (a mounting step).

FIG. 3 (a) illustrating a step of preparing a support sheet (a preparing step),

FIG. 3 (b) illustrating a step of disposing LEDs on the support sheet (an LED disposing step), FIG. 3 (c) illustrating a step of disposing a phosphor sheet on the support sheet (a sheet disposing step), FIG. 3 (d) illustrating a step of encapsulating the LEDs by the phosphor sheet (an encapsulating step) and a step of cutting the phosphor sheet (a cutting step), FIG. 3 (e) illustrating a step of peeling a support board from a pressure-sensitive adhesive layer (a support board peeling step), FIG. 3 (f) illustrating a step of peeling phosphor sheet-covered LEDs from the pressure-sensitive adhesive layer (an LED peeling step), FIG. 3 (f') illustrating a step of describing the details of a state of peeling the phosphor sheet-covered LEDs from the pressure-sensitive adhesive layer using a pick-up device in the LED peeling step in FIG. 3 (f), and FIG. 3 (g) illustrating a step of mounting the phosphor sheet-covered LED on a board (a mounting step).

FIG. 4 shows process drawings for illustrating a third embodiment of a method for producing an encapsulating layer-covered semiconductor element of the present invention:

FIG. 4 (a) illustrating a step of preparing a support sheet (a preparing step),

FIG. 4 (b) illustrating a step of disposing LEDs on the support sheet (an LED disposing step), FIG. 4 (c) illustrating a step of disposing a phosphor sheet on the support sheet (a sheet disposing step), FIG. 4 (d) illustrating a step of encapsulating the LEDs by the phosphor sheet (an encapsulating step) and a step of cutting the phosphor sheet (a cutting step), FIG. 4 (e) illustrating a step of transferring phosphor sheet-covered LEDs onto a transfer sheet, FIG. 4 (f) illustrating a step of transferring the phosphor sheet-covered LEDs onto a stretchable support sheet, FIG. 4 (g) illustrating a step of peeling the phosphor sheet-covered LEDs from the stretchable support sheet, FIG. 4 (g') illustrating a step of describing the details of a state of peeling the phosphor sheet-covered LEDs from the stretchable support sheet using a pick-up device in the LED peeling step in FIG. 4 (g), and FIG. 4 (h) illustrating a step of mounting the phosphor sheet-covered LED on a board (a mounting step).

FIG. 5 (a) illustrating a step of preparing a support sheet (a preparing step),

FIG. 5 (b) illustrating a step of disposing LEDs on the support sheet (an LED disposing step), FIG. 5 (c) illustrating a step of embedding the LEDs by embedding portions of an embedding-reflector sheet (a sheet disposing step), FIG. 5 (d) illustrating a step of encapsulating the LEDs by the embedding portions (an encapsulating step) and a step of cutting a reflector portion (a cutting step), FIG. 5 (e) illustrating a step of peeling phosphor sheet-covered LEDs each including the reflector portion from the support sheet (an LED peeling step), and FIG. 5 (f) illustrating a step of mounting the phosphor sheet-covered LED including the reflector portion on a board (a mounting step).

FIG. 7 (a) illustrating a step of disposing a reflector sheet on a pressing device, FIG. 7 (b) illustrating a step of pressing the reflector sheet to form a reflector portion, FIG. 7 (c) illustrating a step of disposing a phosphor sheet on the reflector portion, FIG. 7 (d) illustrating a step of pressing the phosphor sheet to form embedding portions, and FIG. 7 (e) illustrating a step of peeling the embedding-reflector sheet from a releasing sheet.

FIG. 8 shows process drawings for illustrating a method for producing an embedding-reflector sheet used in a fifth embodiment of a method for producing an encapsulating layer-covered semiconductor element of the present invention:

FIG. 8 (a) illustrating a step of disposing a reflector sheet on a pressing device, FIG. 8 (b) illustrating a step of pressing the reflector sheet to form a reflector portion, FIG. 8 (c) illustrating a step of potting a varnish of a phosphor resin composition into through holes, and FIG. 8 (d) illustrating a step of peeling the embedding-reflector sheet from a releasing sheet.

FIG. 9 shows process drawings for illustrating a sixth embodiment of a method for producing an encapsulating layer-covered semiconductor element of the present invention:

FIG. 9 (a) illustrating a step of preparing a support sheet (a preparing step),

FIG. 9 (b) illustrating a step of disposing LEDs on the support sheet (an LED disposing step), FIG. 9 (c) illustrating a step of embedding the LEDs by embedding portions of an embedding-reflector sheet (a sheet disposing step), FIG. 9 (d) illustrating a step of encapsulating the LEDs by the embedding portions (an encapsulating step) and a step of cutting a reflector portion (a cutting step), FIG. 9 (e) illustrating a step of peeling phosphor sheet-covered LEDs each including the reflector portion from the support sheet (an LED peeling step), and FIG. 9 (f) illustrating a step of mounting the phosphor sheet-covered LED including the reflector portion on a board (a mounting step).

FIG. 10 (a) illustrating a step of preparing a support sheet (a preparing step), FIG. 10 (b) illustrating a step of disposing LEDs on the support sheet (an LED disposing step), FIG. 10 (c) illustrating a step of embedding the LEDs by embedding portions of an embedding-reflector sheet (a sheet disposing step), FIG. 10 (d) illustrating a step of encapsulating the LEDs by the embedding portions (an encapsulating step) and a step of cutting a reflector portion (a cutting step), FIG. 10 (e) illustrating a step of peeling phosphor sheet-covered LEDs each including the reflector portion from the support sheet (an LED peeling step), and FIG. 10 (f) illustrating a step of mounting the phosphor sheet-covered LED including the reflector portion on a board (a mounting step).

FIG. 11 shows process drawings for illustrating a method for producing the embedding-reflector sheet shown in FIG. 10 (b):

FIG. 11 (a) illustrating a step of disposing a reflector sheet on a punching device, FIG. 11 (b) illustrating a step of stamping out the reflector sheet to form a reflector portion, FIG. 11 (c) illustrating a step of disposing a phosphor sheet on the reflector portion, FIG. 11 (d) illustrating a step of pressing the phosphor sheet to form embedding portions, and FIG. 11 (e) illustrating a step of peeling the embedding-reflector sheet from a releasing sheet.

FIG. 12 shows process drawings for illustrating a method for producing an embedding-reflector sheet used in an eighth embodiment of a method for producing an encapsulating layer-covered semiconductor element of the present invention:

FIG. 12 (a) illustrating a step of disposing a reflector sheet on a punching device, FIG. 12 (b) illustrating a step of stamping out the reflector sheet to form a reflector portion, FIG. 12 (c) illustrating a step of potting a varnish of a phosphor resin composition into through holes, and FIG. 12 (d) illustrating a step of peeling the embedding-reflector sheet from a releasing sheet.

FIG. 13 shows process drawings for illustrating a ninth embodiment of a method for producing an encapsulating layer-covered semiconductor element of the present invention:

FIG. 13 (a) illustrating a step of preparing a support sheet (a preparing step), FIG. 13 (b) illustrating a step of disposing LEDs on the support sheet (an LED disposing step), FIG. 13 (c) illustrating a step of covering the LEDs with cover portions (a covering step), FIG. 13 (d) illustrating a step of curing the cover portions (a curing step) and a step of cutting a reflector portion (a cutting step), FIG. 13 (e) illustrating a step of peeling phosphor sheet-covered LEDs each including the reflector portion from the support sheet (an LED peeling step), and FIG. 13 (f) illustrating a step of mounting the phosphor sheet-covered LED including the reflector portion on a board (a mounting step).

FIG. 14 shows process drawings for illustrating a tenth embodiment of a method for producing an encapsulating layer-covered semiconductor element of the present invention:

FIG. 14 (a) illustrating a step of preparing a support sheet (a preparing step), FIG. 14 (b) illustrating a step of disposing LEDs on the support sheet (an LED disposing step), FIG. 14 (c) illustrating a step of covering the side surfaces of the LEDs with a phosphor sheet (a sheet disposing step), FIG. 14 (d) illustrating a step of curing the phosphor sheet (a curing step) and a step of cutting the phosphor sheet (a cutting step), FIG. 14 (e) illustrating a step of peeling phosphor sheet-covered LEDs from the support sheet (an LED peeling step), and FIG. 14 (f) illustrating a step of mounting the phosphor sheet-covered LED on a board (a mounting step).

DETAILED DESCRIPTION OF THE INVENTION

First Embodiment

Figure 1:
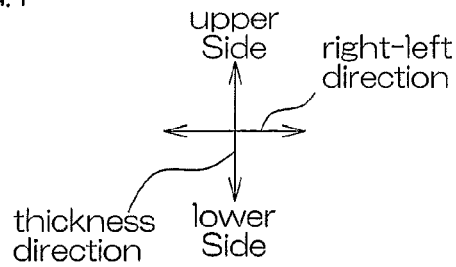
FIG. 1 shows process drawings for illustrating a first embodiment of a method for producing an encapsulating layer-covered semiconductor element of the present invention.
Figure 1:
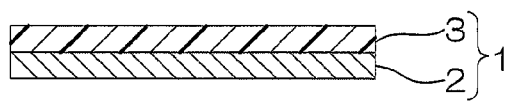
Figure 1:
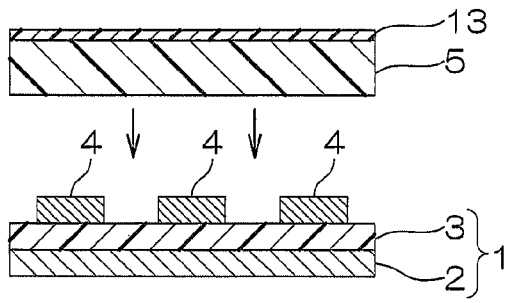
Figure 1:
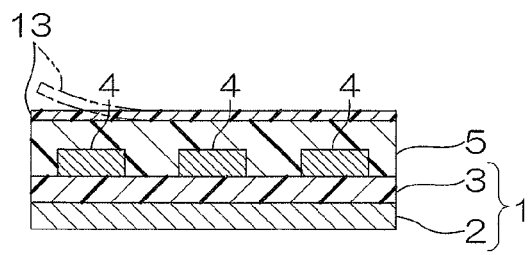
Figure 1:
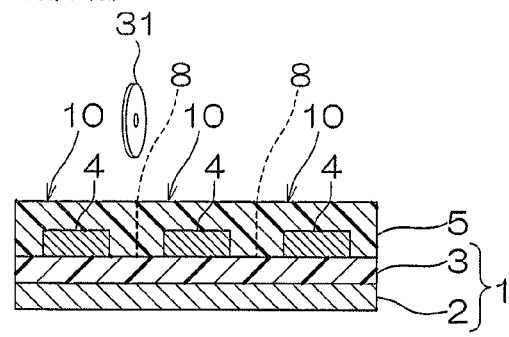
Figure 1:
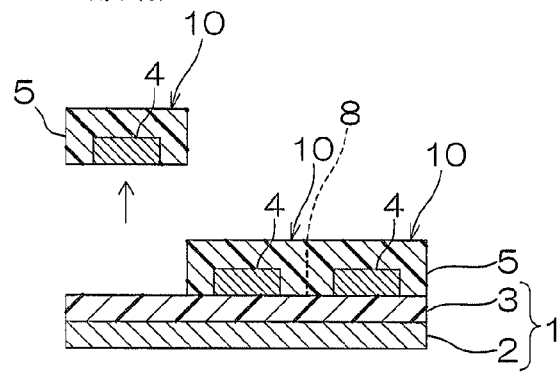
Figure 1:
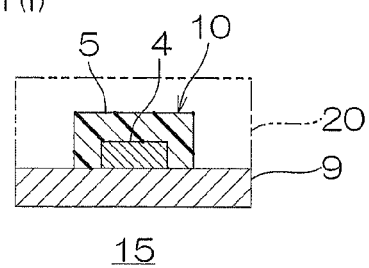

In FIG. 1, the up-down direction of the paper surface is referred to as an up-down direction (a first direction, a thickness direction); the right-left direction of the paper surface is referred to as a right-left direction (a second direction, a direction perpendicular to the first direction); and the paper thickness direction of the paper is referred to as a front-rear direction (a third direction, a direction perpendicular to the first direction and the second direction). Directions and direction arrows in FIG. 2 and the subsequent figures are in conformity with the above-described directions and the direction arrows in FIG. 1.

Figure 2:
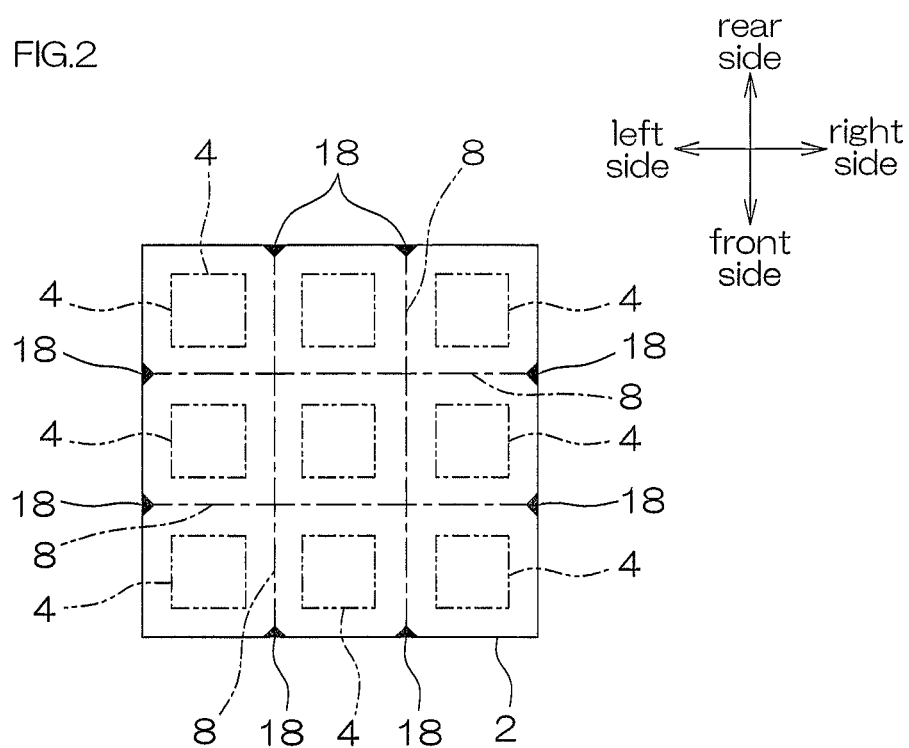
FIG. 2 shows a plan view of the support sheet shown in FIG. 1 (a).

FIG. 1 shows process drawings for illustrating a first embodiment of a method for producing an encapsulating layer-covered semiconductor element of the present invention. FIG. 2 shows a plan view of the support sheet shown in FIG. 1 (a).

In FIG. 2, a pressure-sensitive adhesive layer 3 to be described later is omitted so as to clearly show the relative arrangement of a support board 2 and a reference mark 18 to be described later.

As shown in FIGS. 1 (a) to 1 (e), a method for producing a phosphor sheet-covered LED 10 (also, one example of a phosphor layer-covered LED) as an encapsulating layer-covered semiconductor element includes the steps of preparing a support sheet 1 (ref: FIG. 1 (a)) (a preparing step); disposing LEDs 4 as semiconductor elements on (at one side in the thickness direction of) the support sheet 1 (ref: FIG. 1 (b), a semiconductor element disposing step) (an LED disposing step); after the LED disposing step, disposing a phosphor sheet 5 as an encapsulating sheet that is one example of an encapsulating layer on (at one side in the thickness direction of) the support sheet 1 (ref: FIG. 1 (c), one example of a layer disposing step) (a sheet disposing step); curing the phosphor sheet 5 to encapsulate the LEDs 4 by the phosphor sheet 5 (ref: FIG. 1 (d)) (an encapsulating step); after the encapsulating step, cutting the phosphor sheet 5 corresponding to each of the LEDs 4 to produce the phosphor sheet-covered LEDs 10 (ref: dashed lines in FIG. 1 (d)) (a cutting step); and after the cutting step, peeling the phosphor sheet-covered LEDs 10 from the support sheet 1 (ref: a phantom line in FIG. 1 (e), a semiconductor element peeling step) (an LED peeling step).

In the following, the steps of the first embodiment are described in detail.

[Preparing Step]

As shown in FIGS. 1 (a) and 2, the support sheet 1 is formed into a sheet shape extending in the plane direction (a direction perpendicular to the thickness direction, that is, the right-left direction and the front-rear direction). The support sheet 1 is formed into, for example, a rectangular shape in plane view (a shape when projected in the thickness direction).

The support sheet 1 is prepared so that the reference marks 18, which serve as a reference of cutting in the cutting step to be described later, are provided in advance.

As shown in FIG. 2, a plurality of the reference marks 18 are provided at spaced intervals to each other at the circumference end portion in the plane direction of the support sheet 1. The reference marks 18 are, for example, provided at two sides that are opposed to each other in the support sheet 1. The reference marks 18 are formed to make a pair opposing to each other in an opposing direction of the two sides of the support sheet 1. One pair of the reference marks 18 is provided corresponding to the LEDs 4 that are subsequently disposed and is disposed so as to be capable of singulating the LEDs 4 when the phosphor sheet 5 is cut with the reference marks 18 as a reference.

Each of the reference marks 18 is formed into a shape that is easily recognized in plane view and is, for example, formed into a generally triangular shape in plane view.

The maximum length of the support sheet 1 is, for example, 10 mm or more and 300 mm or less.

The support sheet 1 is configured to be capable of supporting the LEDs 4 (ref: FIG. 1 (*b*)) to be described next and as shown in FIGS. 1 (*a*) and 2, includes, for example, the support board 2 and the pressure-sensitive adhesive layer 3 that is laminated on the upper surface of the support board 2.

The support board 2 is formed into a plate shape extending in the plane direction. The support board 2 is provided in the lower portion of the support sheet 1 and is formed to have the generally same shape as that of the support sheet 1 in plane view.

In the upper portion of the support board 2, the reference marks 18 are formed. The reference marks 18 are, in sectional view, though not shown, formed as concave portions that dent from the upper surface toward the middle in the up-down direction of the support board 2 or as through holes that pass through in the up-down direction thereof.

The support board 2 is incapable of stretching at least in the plane direction and is formed of a hard material. To be specific, examples of the material include an oxide such as a silicon oxide (silica or the like) and alumina, a metal such as stainless steel, and silicon.

The support board 2 has a Young's modulus at 23° C. of, for example, $1\times10^6$ Pa or more, preferably $1\times10^7$ Pa or more, or more preferably $1\times10^8$ Pa or more, and of, for example, $1\times10^{12}$ Pa or less. When the Young's modulus of the support board 2 is not less than the above-described lower limit, hardness of the support board 2 is secured and the LEDs 4 (ref: FIG. 1 (*b*)) to be described later can be further surely supported. The Young's modulus of the support board 2 is obtained by, for example, the compressive elastic modulus in JIS H 7902:2008.

The thickness of the support board 2 is, for example, 0.1 mm or more, or preferably 0.3 mm or more, and is, for example, 5 mm or less, or preferably 2 mm or less.

The pressure-sensitive adhesive layer 3 is formed on the entire upper surface of the support board 2.

An example of a pressure-sensitive adhesive material for forming the pressure-sensitive adhesive layer 3 includes a pressure-sensitive adhesive such as an acrylic pressure-sensitive adhesive and a silicone pressure-sensitive adhesive. The pressure-sensitive adhesive layer 3 can be also formed of, for example, an active energy ray irradiation release sheet in which the pressure-sensitive adhesive force is capable of being reduced by application of an active energy ray (to be specific, an active energy ray irradiation release sheet described in Japanese Unexamined Patent Publication No. 2005-286003 or the like) or a thermal release sheet in which the pressure-sensitive adhesive force is capable of being reduced by heating (to be specific, a thermal release sheet such as REVALPHA (manufactured by NITTO DENKO CORPORATION)). To be specific, when a phosphor resin composition in the phosphor sheet 5 (ref: the upper portion in FIG. 1 (*b*)) to be described later contains a thermosetting resin, preferably, the pressure-sensitive adhesive layer 3 is formed of an active energy ray irradiation release sheet. On the other hand, when the phosphor resin composition in the phosphor sheet 5 to be described later contains an active energy ray curable resin, preferably, the pressure-sensitive adhesive layer 3 is formed of a thermal release sheet.

The thickness of the pressure-sensitive adhesive layer 3 is, for example, 0.1 mm or more, or preferably 0.2 mm or more, and is, for example, 1 mm or less, or preferably 0.5 mm or less.

In order to prepare the support sheet 1, for example, the support board 2 is attached to the pressure-sensitive adhesive layer 3. Also, the pressure-sensitive adhesive layer 3 can be directly laminated on the support board 2 by an application method or the like in which first, the support board 2 is prepared; next, a varnish prepared from the above-described pressure-sensitive adhesive material and a solvent blended as required is applied to the support board 2; and thereafter, the solvent is distilled off as required.

The thickness of the support sheet 1 is, for example, 0.2 mm or more, or preferably 0.5 mm or more, and is, for example, 6 mm or less, or preferably 2.5 mm or less.

[LED Disposing Step]

In the LED disposing step, as shown in FIG. 1 (*b*) and by the phantom lines in FIG. 2, a plurality of the LEDs 4 are prepared to be disposed on the support sheet 1.

The LEDs 4 are semiconductor elements that convert electrical energy to light energy. Each of the LEDs 4 is, for example, formed into a generally rectangular shape in sectional view and a generally rectangular shape in plane view with the thickness shorter than the length in the plane direction (the maximum length). The lower surface of each of the LEDs 4 is formed of a bump that is not shown. An example of the LEDs 4 includes blue light emitting diode elements that emit blue light.

The maximum length of each of the LEDs 4 is, for example, 0.1 mm or more and 3 mm or less. The thickness thereof is, for example, 0.05 mm or more and 1 mm or less.

In the LED disposing step, for example, a plurality of the LEDs 4 are disposed in alignment on the support sheet 1. To be specific, a plurality of the LEDs 4 are disposed in such a manner that a plurality of the LEDs 4 are arranged at equal intervals to each other in the front-rear and the right-left directions in plane view. The LEDs 4 are attached to the pressure-sensitive adhesive layer 3 so that the bumps thereof that are not shown are opposed to the support sheet 1. In this way, the LEDs 4 are supported at (pressure-sensitively adhere to) the upper surface of the support board 2 via the pressure-sensitive adhesive layer 3 so that the alignment state thereof is retained.

The gap between the LEDs 4 is, for example, 0.05 mm or more and 2 mm or less.

[Sheet Disposing Step]

In FIG. 1 (*c*), the phosphor sheet 5 is formed from a phosphor resin composition containing a curable resin and a phosphor into a sheet shape.

Examples of the curable resin include a thermosetting resin that is cured by heating and an active energy ray curable resin that is cured by application of an active energy ray (for example, an ultraviolet ray and an electron beam). Preferably, a thermosetting resin is used.

To be specific, an example of the curable resin includes a thermosetting resin such as a silicone resin, an epoxy resin, a polyimide resin, a phenol resin, a urea resin, a melamine resin, and an unsaturated polyester resin. Preferably, a silicone resin is used.

An example of the silicone resin includes a silicone resin such as a two-step curable type silicone resin and a one-step curable type silicone resin. Preferably, a two-step curable type silicone resin is used.

The two-step curable type silicone resin is a thermosetting silicone resin that has a two-step reaction mechanism and in which a silicone resin is brought into a B-stage state (a semi-cured state) in the first-step reaction and is brought into a C-stage state (a completely cured state) in the second-step reaction. On the other hand, the one-step curable type silicone resin is a thermosetting silicone resin that has a one-step reaction mechanism and in which a silicone resin is completely cured in the first-step reaction.

The B-stage state is a state between an A-stage state in which a thermosetting silicone resin is in a liquid state and a C-stage state in which the thermosetting silicone resin is completely cured. Also, the B-stage state is a state in which the curing and the gelation of the thermosetting silicone resin are slightly progressed and the compressive elastic modulus thereof is smaller than the elastic modulus thereof in a C-stage state.

An example of the two-step curable type silicone resin includes a condensation reaction and addition reaction curable type silicone resin that has two reaction systems of a condensation reaction and an addition reaction.

The mixing ratio of the curable resin with respect to the phosphor resin composition is, for example, 30 mass % or more, or preferably 50 mass % or more, and is, for example, 99 mass % or less, or preferably 95 mass % or less.

The phosphor has a wavelength conversion function and examples thereof include a yellow phosphor that is capable of converting blue light into yellow light and a red phosphor that is capable of converting blue light into red light.

Examples of the yellow phosphor include a garnet type phosphor having a garnet type crystal structure such as $Y_3Al_5O_{12}$:Ce (YAG (yttrium aluminum garnet):Ce) and $Tb_3Al_3O_{12}$:Ce (TAG (terbium aluminum garnet):Ce) and an oxynitride phosphor such as Ca-α-SiAlON.

An example of the red phosphor includes a nitride phosphor such as $CaAlSiN_3$:Eu and $CaSiN_2$:Eu.

Preferably, a yellow phosphor is used.

Examples of a shape of the phosphor include a sphere shape, a plate shape, and a needle shape. Preferably, in view of fluidity, a sphere shape is used.

The average value of the maximum length (in the case of a sphere shape, the average particle size) of the phosphor is, for example, 0.1 μm or more, or preferably 1 μm or more, and is, for example, 200 μm or less, or preferably 100 μm or less.

The mixing ratio of the phosphor with respect to 100 parts by mass of the curable resin is, for example, 0.1 parts by mass or more, or preferably 0.5 parts by mass or more, and is, for example, 80 parts by mass or less, or preferably 50 parts by mass or less.

Furthermore, the phosphor resin composition can also contain a filler.

Examples of the filler include organic microparticles such as silicone particles and inorganic microparticles such as silica, talc, alumina, aluminum nitride, and silicon nitride. The mixing ratio of the filler with respect to 100 parts by mass of the curable resin is, for example, 0.1 parts by mass or more, or preferably 0.5 parts by mass or more, and is, for example, 70 parts by mass or less, or preferably 50 parts by mass or less.

As shown in FIG. 1 (c), in order to dispose the phosphor sheet 5 on the support sheet 1, first, as shown by the upper portion in FIG. 1 (b), the phosphor sheet 5 is prepared. In order to prepare the phosphor sheet 5, a curable resin and a phosphor, and a filler, which is blended as required, are blended to prepare a phosphor resin composition. Next, the phosphor resin composition is applied to the surface of a release sheet 13 to be then heated. Examples of the release sheet 13 include a polymer film such as a polyethylene film and a polyester film (PET or the like), a ceramic sheet, and a metal foil. Preferably, a polymer film is used. The surface of the release sheet 13 can be also subjected to release treatment such as fluorine treatment.

When the curable resin contains a two-step curable type silicone resin, the curable resin is brought into a B-stage state (a semi-cured state) by the above-described heating. That is, the phosphor sheet 5 in a B-stage state is prepared.

The phosphor sheet 5 has a compressive elastic modulus at 23° C. of, for example, 0.01 MPa or more, or preferably 0.04 MPa or more, and of, for example, 1.0 MPa or less, or preferably 0.5 MPa or less.

When the compressive elastic modulus of the phosphor sheet 5 is not more than the above-described upper limit, sufficient flexibility can be secured. On the other hand, when the compressive elastic modulus of the phosphor sheet 5 is not less than the above-described lower limit, the LEDs 4 can be embedded.

Next, as shown in FIG. 1 (c), the phosphor sheet 5 is disposed on the support sheet 1 so as to embed the LEDs 4 (an embedding step). That is, the phosphor sheet 5 is disposed on the support sheet 1 so as to cover the upper surfaces and the side surfaces of the LEDs 4.

To be specific, as shown by arrows in FIG. 1 (b), the phosphor sheet 5 laminated on the release sheet 13 is compressively bonded toward the pressure-sensitive adhesive layer 3.

In this way, in the sheet disposing step, the embedding step in which the LEDs 4 are embedded by the phosphor sheet 5 is performed.

Thereafter, as shown by the phantom line in FIG. 1 (c), the release sheet 13 is peeled from the upper surface of the phosphor sheet 5.

[Encapsulating Step]

The encapsulating step is performed after the sheet disposing step (ref: FIG. 1 (c)).

In the encapsulating step, as shown in FIG. 1 (d), the phosphor sheet 5 is cured. When the curable resin is a thermosetting resin, the phosphor sheet 5 is thermally cured. To be specific, the phosphor sheet 5 is heated at, for example, 80° C. or more, or preferably 100° C. or more, and at, for example, 200° C. or less, or preferably 180° C. or less.

When the thermosetting resin contains a two-step curable type silicone resin and when the phosphor sheet 5 that embeds the LEDs 4 is in a B-stage state, the phosphor sheet 5 is completely cured (subjected to a final curing) to be brought into a C-stage state by the above-described heating.

When the thermosetting resin contains a one-step curable type silicone resin, the phosphor sheet 5 is completely cured (subjected to a final curing) to be brought into a C-stage state by the above-described heating.

When the curable resin is an active energy ray curable resin, an active energy ray is applied to the phosphor sheet 5 from the upper side.

The cured (completely cured) phosphor sheet 5 has flexibility. To be specific, the cured (completely cured) phosphor sheet 5 has a compressive elastic modulus at 23° C. of for example, 0.5 MPa or more, or preferably 1 MPa or more, and of, for example, 100 MPa or less, or preferably 10 MPa or less.

When the compressive elastic modulus of the phosphor sheet 5 is not more than the above-described upper limit, the flexibility can be surely secured and in the cutting step (ref: FIG. 1 (d)) to be described next, for example, the phosphor sheet 5 can be cut using a cutting device (described later). When the compressive elastic modulus of the phosphor sheet 5 is not less than the above-described lower limit, the shape thereof after being cut can be retained.

In this way, the side surfaces and the upper surfaces of the LEDs 4, and a portion of the upper surface of the pressure-sensitive adhesive layer 3 that is exposed from the LEDs 4 are covered with the phosphor sheet 5 in close contact with each other. That is, the LEDs 4 are encapsulated by the phosphor sheet 5 in a C-stage state.

[Cutting Step]

As shown by the dashed lines in FIG. 1 (d), in the cutting step, the flexible phosphor sheet 5 around the LEDs 4 is cut along the thickness direction. As shown by dash-dot lines in FIG. 2, for example, the phosphor sheet 5 is cut into a generally rectangular shape in plane view that surrounds each of the LEDs 4.

In order to cut the phosphor sheet 5, for example, a dicing device using a disc-shaped dicing saw (dicing blade) 31 (ref: FIG. 1 (d)), a cutting device using a cutter, a laser irradiation device, or the like is used.

The cutting of the phosphor sheet 5 is performed with the reference marks 18 as a reference. To be specific, the phosphor sheet 5 is cut so as to form cuts 8 along the straight lines (shown by the dash-dot lines in FIG. 2) that connect the reference marks 18 making one pair.

In the cutting of the phosphor sheet 5, for example, the phosphor sheet 5 is cut from the upper surface toward the lower surface so that the cuts 8 fail to pass through the support sheet 1, to be specific, fail to pass through the pressure-sensitive adhesive layer 3.

By the cutting step, the phosphor sheet-covered LEDs 10, each of which includes the LED 4 and the phosphor sheet 5 that is cut so as to cover the LED 4, are obtained in a state of being in close contact with the support sheet 1.

[LED Peeling Step]

In FIG. 1 (e), in the LED peeling step, each of the phosphor sheet-covered LEDs 10 is peeled from the upper surface of the pressure-sensitive adhesive layer 3. That is, each of the phosphor sheet-covered LEDs 10 is peeled from the support board 2 and the pressure-sensitive adhesive layer 3.

In this way, the phosphor sheet-covered LED 10 peeled from the support sheet 1 is obtained.

[Mounting Step]

Thereafter, after the phosphor sheet-covered LED 10 is selected in accordance with emission wavelength and luminous efficiency, as shown in FIG. 1 (f), the selected phosphor sheet-covered LED 10 is mounted on a board 9. In this way, an LED device 15 as a semiconductor device is obtained.

To be specific, the phosphor sheet-covered LED 10 is disposed in opposed relation to the board 9 so that a bump (not shown) in the LED 4 is opposed to a terminal (not shown) provided on the upper surface of the board 9. That is, the LED 4 in the phosphor sheet-covered LED 10 is flip-chip mounted on the board 9.

In this way, the LED device 15 including the board 9 and the phosphor sheet-covered LED 10 that is mounted on the board 9 is obtained.

Thereafter, as shown by the phantom line in FIG. 1 (f), an encapsulating protective layer 20 (an encapsulating layer that is different from the phosphor sheet 5) that encapsulates the phosphor sheet-covered LED 10 is provided in the LED device 15 as required. In this way, reliability of the LED device 15 can be improved.

In the method for producing the phosphor sheet-covered LED 10, after the cutting step, each of the phosphor sheet-covered LEDs 10 is peeled from the support sheet 1. That is, in the cutting step, the phosphor sheet 5 is capable of being cut, while the LEDs 4 and the phosphor sheet 5 are supported by the support sheet 1 including the hard support board 2. Thus, the phosphor sheet-covered LED 10 having excellent size stability can be obtained.

After the encapsulating step in which the phosphor sheet 5 is cured, the cutting step in which the phosphor sheet 5 is cut is performed, so that a dimensional deviation caused by shrinkage of the phosphor sheet 5 that may occur in the curing can be cancelled in the cutting step. Thus, the phosphor sheet-covered LED 10 having further excellent size stability can be obtained.

In addition, the phosphor sheet 5 that encapsulates the LEDs 4 is flexible, so that in the cutting step, the phosphor sheet 5 is capable of being smoothly cut not only using an expensive dicing device, but also using various cutting devices including a relatively cheap cutting device.

In addition, in the sheet disposing step in this method, the LEDs 4 are embedded by the phosphor sheet 5 in a B-stage state; in the encapsulating step, the phosphor sheet 5 is cured to be brought into a C-stage state; and the phosphor sheet 5 in a C-stage state encapsulates the LEDs 4. Thus, the LEDs 4 are easily and surely covered with the phosphor sheet 5 in a B-stage state and the phosphor sheet 5 in a C-stage state is capable of surely encapsulating the LEDs 4. Therefore, the phosphor sheet-covered LED 10 having excellent reliability can be obtained.

The phosphor sheet 5 shown in FIG. 1 (b) is formed into a sheet shape, so that it is capable of collectively encapsulating a plurality of the LEDs 4. Thus, production efficiency of the phosphor sheet-covered LED 10 can be improved.

Consequently, the phosphor sheet-covered LED 10 has excellent size stability.

Also, the LED device 15 includes the phosphor sheet-covered LED 10 having excellent size stability, so that it has excellent reliability and therefore, its luminous efficiency is improved.

Modified Example

In the above-described preparing step in the first embodiment (ref: FIG. 1 (a)), the support sheet 1 is prepared so as to include the support board 2 and the pressure-sensitive adhesive layer 3. Alternatively, for example, though not shown, the support sheet 1 can be also prepared so as to include the support board 2 only without including the pressure-sensitive adhesive layer 3.

Preferably, as shown in FIG. 1 (a), the support sheet 1 is prepared so as to include the support board 2 and the pressure-sensitive adhesive layer 3.

In this way, in the LED disposing step shown in FIG. 1 (b), when the LEDs 4 are disposed on the support sheet 1, the LEDs 4 can adhere to the support board 2 via the pressure-sensitive adhesive layer 3. Thus, the support sheet 1 can surely support the LEDs 4.

In the preparing step in this method, the support sheet 1 is prepared so that the reference marks 18, which serve as a reference of cutting in the cutting step, are provided in advance.

On the other hand, in the method described in Japanese Unexamined Patent Publication No. 2001-308116 in which dummy wafers are peeled from a silica glass substrate or a pressure-sensitive adhesive sheet to be then subjected to dicing, the dummy wafers are not on the silica glass substrate when subjected to dicing and thus, the dicing is not capable of being performed with the above-described reference marks 18 as a reference.

In contrast, in the first embodiment, the LEDs 4 are supported by the support sheet 1 in the cutting step, so that in this way, the LEDs 4 can be singulated with excellent accuracy with the reference marks 18 as a reference.

In FIG. 2, each of the reference marks 18 is formed into a generally triangular shape in plane view. However, the shape thereof is not particularly limited and can be formed into an appropriate shape such as a generally circular shape in plane view, a generally rectangular shape in plane view, a generally X-shape in plane view, and a generally T-shape in plane view.

Second Embodiment

Figure 3:
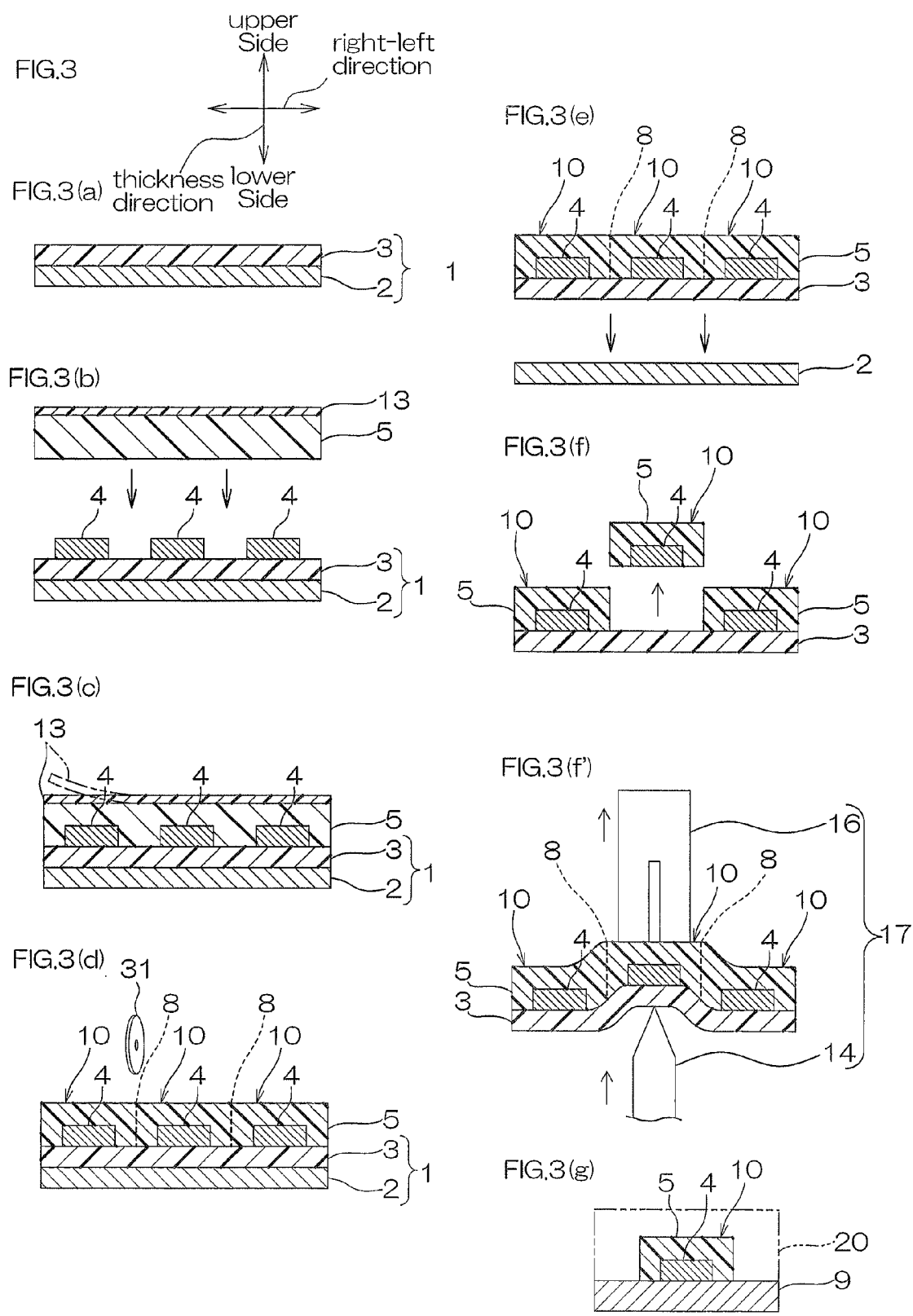
FIG. 3 shows process drawings for illustrating a second embodiment of a method for producing an encapsulating layer-covered semiconductor element of the present invention.

FIG. 3 shows process drawings for illustrating a second embodiment of a method for producing an encapsulating layer-covered semiconductor element of the present invention.

In the second embodiment, the same reference numerals are provided for members and steps corresponding to each of those in the first embodiment, and their detailed description is omitted.

In the LED peeling step (ref: FIG. 1 (e)) in the first embodiment, each of the phosphor sheet-covered LEDs 10 is peeled from the support board 2 and the pressure-sensitive adhesive layer 3. Alternatively, for example, as shown in FIG. 3 (e), first, the support board 2 is peeled from the pressure-sensitive adhesive layer 3 and thereafter, as shown in FIG. 3 (f), each of the phosphor sheet-covered LEDs 10 can be peeled from the pressure-sensitive adhesive layer 3 only.

That is, this method includes the same steps of preparing step (ref: FIG. 3 (a)), LED disposing step (ref: FIG. 3 (b)), sheet disposing step (ref: FIG. 3 (c)), encapsulating step (ref: FIG. 3 (d)), cutting step (ref: the dashed lines in FIG. 3 (d)), and LED peeling step (ref: the phantom line in FIG. 3 (f)) as those in the first embodiment. In addition, as shown in FIG. 3 (e), this method further includes a support board peeling step in which the support board 2 is peeled from the pressure-sensitive adhesive layer 3 after the cutting step (ref: FIG. 3 (d)) and before the LED peeling step (ref: FIG. 3 (f)).

[Support Board Peeling Step]

As shown in FIG. 3 (e), in the support board peeling step, the support board 2 is peeled from the lower surface of the pressure-sensitive adhesive layer 3.

In order to peel the support board 2 from the pressure-sensitive adhesive layer 3, for example, the pressure-sensitive adhesive layer 3 is formed from a pressure-sensitive adhesive in which the pressure-sensitive adhesive force is capable of being reduced by application of an active energy ray such as an ultraviolet ray and the active energy ray is applied to the pressure-sensitive adhesive layer 3, so that the pressure-sensitive adhesive force of the pressure-sensitive adhesive layer 3 is reduced. Thereafter, the support board 2 is peeled from the pressure-sensitive adhesive layer 3.

Alternatively, the pressure-sensitive adhesive layer 3 is formed from a pressure-sensitive adhesive in which the pressure-sensitive adhesive force is capable of being reduced by heating and the pressure-sensitive adhesive layer 3 is heated, so that the pressure-sensitive adhesive force of the pressure-sensitive adhesive layer 3 is reduced. Thereafter, the support board 2 is peeled from the pressure-sensitive adhesive layer 3.

[LED Peeling Step]

Next, in the LED peeling step shown by the arrow in FIG. 3 (f), each of the phosphor sheet-covered LEDs 10 is peeled from the pressure-sensitive adhesive layer 3.

To be specific, as shown in FIG. 3 (f), for example, each of the phosphor sheet-covered LEDs 10 is peeled from the pressure-sensitive adhesive layer 3 with a pick-up device 17 that is provided with a pressing member 14 such as a needle and an absorbing member 16 such as a collet. In the pick-up device 17, the pressing member 14 presses (pushes up) the pressure-sensitive adhesive layer 3 corresponding to the phosphor sheet-covered LED 10 that is intended to be peeled off from the lower side thereof. In this way, the phosphor sheet-covered LED 10 that is intended to be peeled off is pushed up upwardly, and the pushed-up phosphor sheet-covered LED 10 is peeled from the pressure-sensitive adhesive layer 3, while being absorbed by the absorbing member 16 such as a collet.

In this way, as shown in FIG. 3 (f), each of the phosphor sheet-covered LEDs 10 that is peeled from the support sheet 1 is obtained.

[Mounting Step]

Thereafter, after the phosphor sheet-covered LED 10 is selected in accordance with emission wavelength and luminous efficiency, as shown in FIG. 3 (g), the selected phosphor sheet-covered LED 10 is mounted on the board 9. In this way, the LED device 15 is obtained.

According to this method, in the LED peeling step, each of the phosphor sheet-covered LEDs 10 is peeled from the pressure-sensitive adhesive layer 3, so that the phosphor sheet-covered LED 10 can be easily and surely peeled from the pressure-sensitive adhesive layer 3 using the above-described pick-up device 17.

Third Embodiment

FIG. 4 shows process drawings for illustrating a third embodiment of a method for producing an encapsulating layer-covered semiconductor element of the present invention.

In the third embodiment, the same reference numerals are provided for members and steps corresponding to each of those in the first and second embodiments, and their detailed description is omitted.

In the LED peeling steps (ref: FIGS. 1 (e) and 3 (f)) in the first and second embodiments, each of the phosphor sheet-covered LEDs 10 is peeled from the support sheet 1 to be then mounted on the board 9 (ref: FIGS. 1 (f) and 3 (g)). Alternatively, for example, as shown in FIGS. 4 (e) and 4 (f), the phosphor sheet-covered LEDs 10 are sequentially transferred onto a transfer sheet 11 and a stretchable support sheet 12, and thereafter, as shown in FIG. 4 (g), each of the phosphor sheet-covered LEDs 10 can be peeled from the stretchable support sheet 12.

That is, this method includes the same steps of preparing step (ref: FIG. 4 (a)), LED disposing step (ref: FIG. 4 (b)), sheet disposing step (ref: FIG. 4 (c)), encapsulating step (ref: FIG. 4 (d)), and cutting step (ref: the dashed lines in FIG. 4 (d)) as those in the first embodiment and furthermore, includes the above-described LED peeling step (ref: FIGS. 4 (e) to 4 (g)).

[LED Peeling Step]

The LED peeling step includes the steps of transferring the phosphor sheet-covered LEDs 10 onto the stretchable support sheet 12 (ref: FIG. 4 (*f*)) and peeling the phosphor sheet-covered LEDs 10 from the stretchable support sheet 12, while stretching the stretchable support sheet 12 in the plane direction (ref: FIGS. 4 (*g*) and 4 (*g'*).

That is, in order to transfer the phosphor sheet-covered LEDs 10 onto the stretchable support sheet 12, as shown by the arrows in FIG. 4 (*d*), and in FIG. 4 (*e*), the phosphor sheet-covered LEDs 10 after the cutting step (ref: the dashed lines in FIG. 4 (*d*)) are transferred onto the transfer sheet 11 in advance.

The transfer sheet 11 is formed of the same material and with the same thickness as those in the stretchable support sheet 12 to be described next.

By the transfer of the phosphor sheet-covered LEDs 10 onto the transfer sheet 11, the lower surface of the phosphor sheet 5 is in contact (in close contact) with the upper surface of the transfer sheet 11, while the upper surfaces of the LEDs 4 in which bumps that are not shown are formed on a part of the upper surfaces are exposed from the phosphor sheet 5 around the LEDs 4.

Thereafter, as shown in FIG. 4 (*f*), the phosphor sheet-covered LEDs 10 are transferred onto the stretchable support sheet 12.

The stretchable support sheet 12 is a stretchable pressure-sensitive adhesive sheet that is capable of stretching in the plane direction. Examples thereof include an active energy ray irradiation release sheet in which the pressure-sensitive adhesive force is capable of being reduced by application of an active energy ray (to be specific, an active energy ray irradiation release sheet described in Japanese Unexamined Patent Publication No. 2005-286003 or the like) and a thermal release sheet in which the pressure-sensitive adhesive force is capable of being reduced by heating (to be specific, a thermal release sheet such as REVALPHA (manufactured by NITTO DENKO CORPORATION)). Preferably, an active energy ray irradiation release sheet is used.

The stretchable support sheet 12 has a tensile elasticity at 23° C. of, for example, 0.01 MPa or more, or preferably 0.1 MPa or more, and of, for example, 10 MPa or less, or preferably 1 MPa or less.

The thickness of the stretchable support sheet 12 is, for example, 0.1 mm or more and 1 mm or less.

A commercially available product can be used as the stretchable support sheet 12. To be specific, the UE series (manufactured by NITTO DENKO CORPORATION) or the like is used.

By the transfer of the phosphor sheet-covered LEDs 10 onto the stretchable support sheet 12, the upper surface of the phosphor sheet 5 is exposed upwardly, while the lower surfaces of the LEDs 4 in which bumps that are not shown are formed on a part of the lower surfaces are in contact (in close contact) with the upper surface of the stretchable support sheet 12.

[LED Peeling Step]

Thereafter, as shown in FIG. 4 (*g*), the stretchable support sheet 12 is stretched in the plane direction and each of the phosphor sheet-covered LEDs 10 is peeled from the stretchable support sheet 12.

To be specific, first, as shown by the arrows in FIG. 4 (*f*), the stretchable support sheet 12 is stretched outwardly in the plane direction. In this way, as shown in FIG. 4 (*g*), in a state where the phosphor sheet-covered LEDs 10 are in close contact with the stretchable support sheet 12, the tensile stress is concentrated in the cuts 8; thus, the cuts 8 expand; and the LEDs 4 are separated from each other, so that gaps 19 are formed. Each of the gaps 19 is formed into a generally grid shape in plane view so as to separate the LEDs 4.

Subsequently, as shown in FIG. 4 (*g'*), the stretchable support sheet 12 corresponding to the phosphor sheet-covered LED 10 that is intended to be peeled off is pushed up from the lower side thereof by the pressing member 14. In this way, the phosphor sheet-covered LED 10 is pushed up upwardly, and the pushed-up phosphor sheet-covered LED 10 is peeled from the stretchable support sheet 12, while being absorbed by the absorbing member 16.

When the stretchable support sheet 12 is an active energy ray irradiation release sheet, in a case where each of the phosphor sheet-covered LEDs 10 is peeled from the stretchable support sheet 12, an active energy ray is applied to the stretchable support sheet 12. When the stretchable support sheet 12 is a thermal release sheet, the stretchable support sheet 12 is heated. The pressure-sensitive adhesive force of the stretchable support sheet 12 is reduced by those treatments, so that each of the phosphor sheet-covered LEDs 10 can be easily and surely peeled from the stretchable support sheet 12.

In this way, each of the phosphor sheet-covered LEDs 10 that is peeled from the support sheet 1 is obtained.

[Mounting Step]

Thereafter, after the phosphor sheet-covered LED 10 is selected in accordance with emission wavelength and luminous efficiency, as shown in FIG. 4 (*h*), the selected phosphor sheet-covered LED 10 is mounted on the board 9. In this way, the LED device 15 is obtained.

In this method, the stretchable support sheet 12 is stretched in the plane direction and each of the phosphor sheet-covered LEDs 10 is peeled from the stretchable support sheet 12.

Thus, the gaps 19 are formed around each of the phosphor sheet-covered LEDs 10, so that each of the phosphor sheet-covered LEDs 10 can be further easily and surely peeled from the stretchable support sheet 12 using the pick-up device 17.

Additionally, the gap 19 is formed between the phosphor sheet-covered LED 10 that is intended to be peeled off and the phosphor sheet-covered LED 10 that is adjacent thereto. Thus, it can be prevented that when the absorbing member 16 is brought into contact with the phosphor sheet-covered LED 10 that is intended to be peeled off, the absorbing member 16 comes in contact with the phosphor sheet-covered LED 10 that is adjacent thereto to cause a damage to the phosphor sheet-covered LED 10.

Fourth Embodiment

Figure 5:
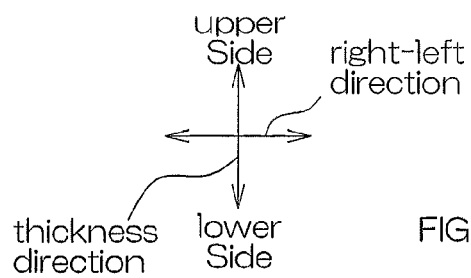
FIG. 5 shows process drawings for illustrating a fourth embodiment of a method for producing an encapsulating layer-covered semiconductor element of the present invention.
Figure 5A:
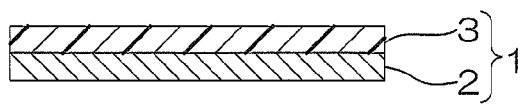
Figure 5B:
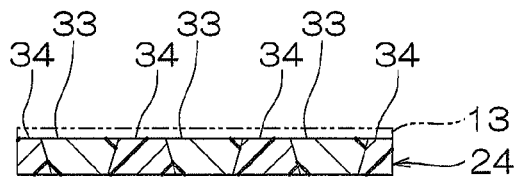
Figure 5C:
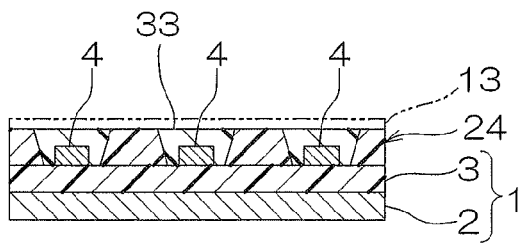
Figure 5D:
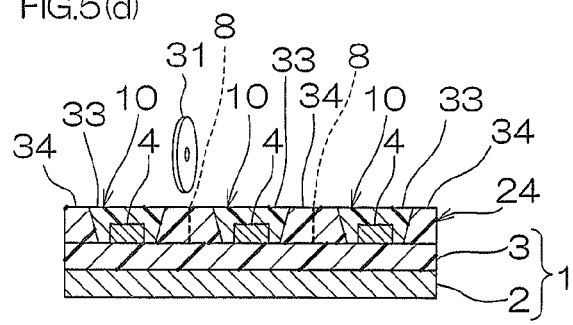
Figure 5E:
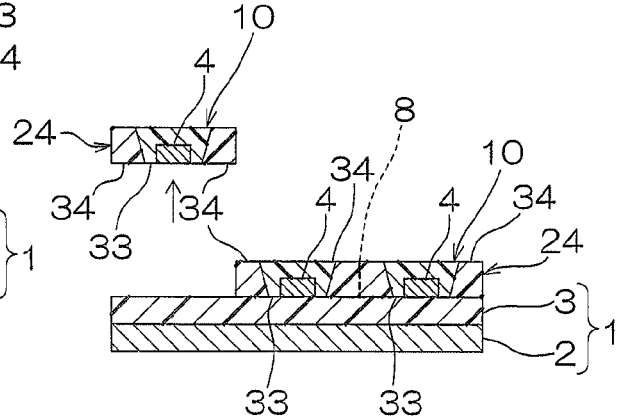
Figure 5F:
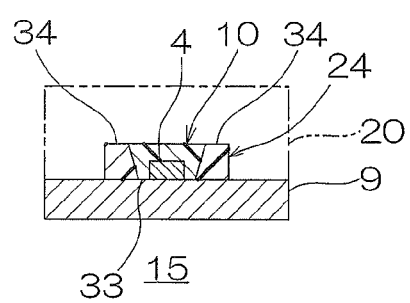
Figure 6:
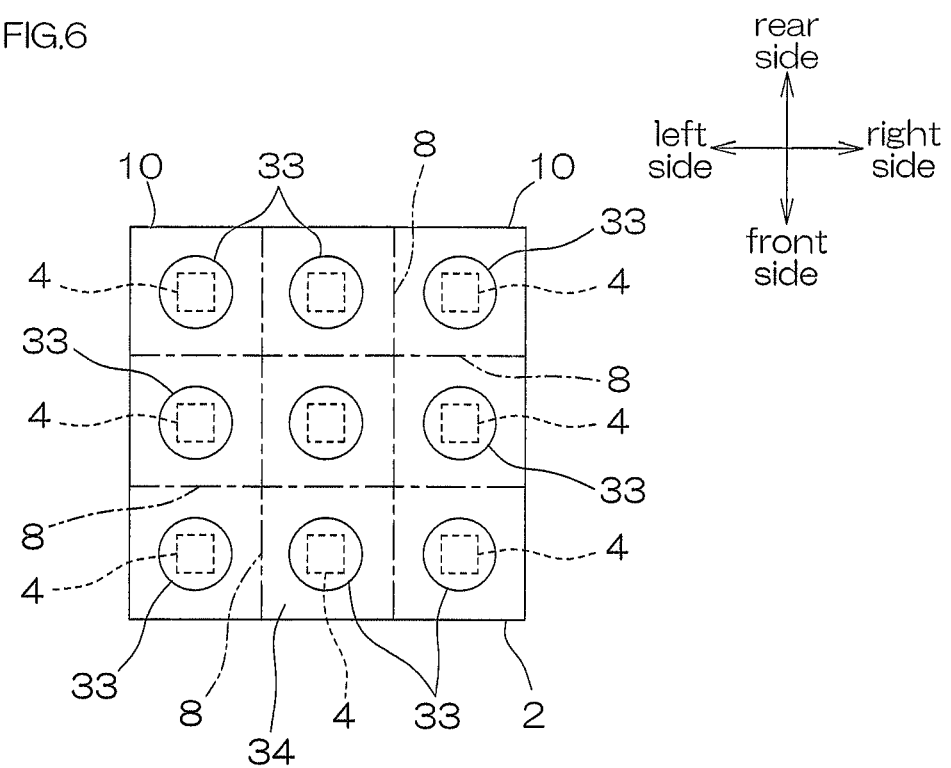
FIG. 6 shows a plan view of the phosphor sheet-embedded LEDs shown in FIG. 5 (d).
Figure 7:
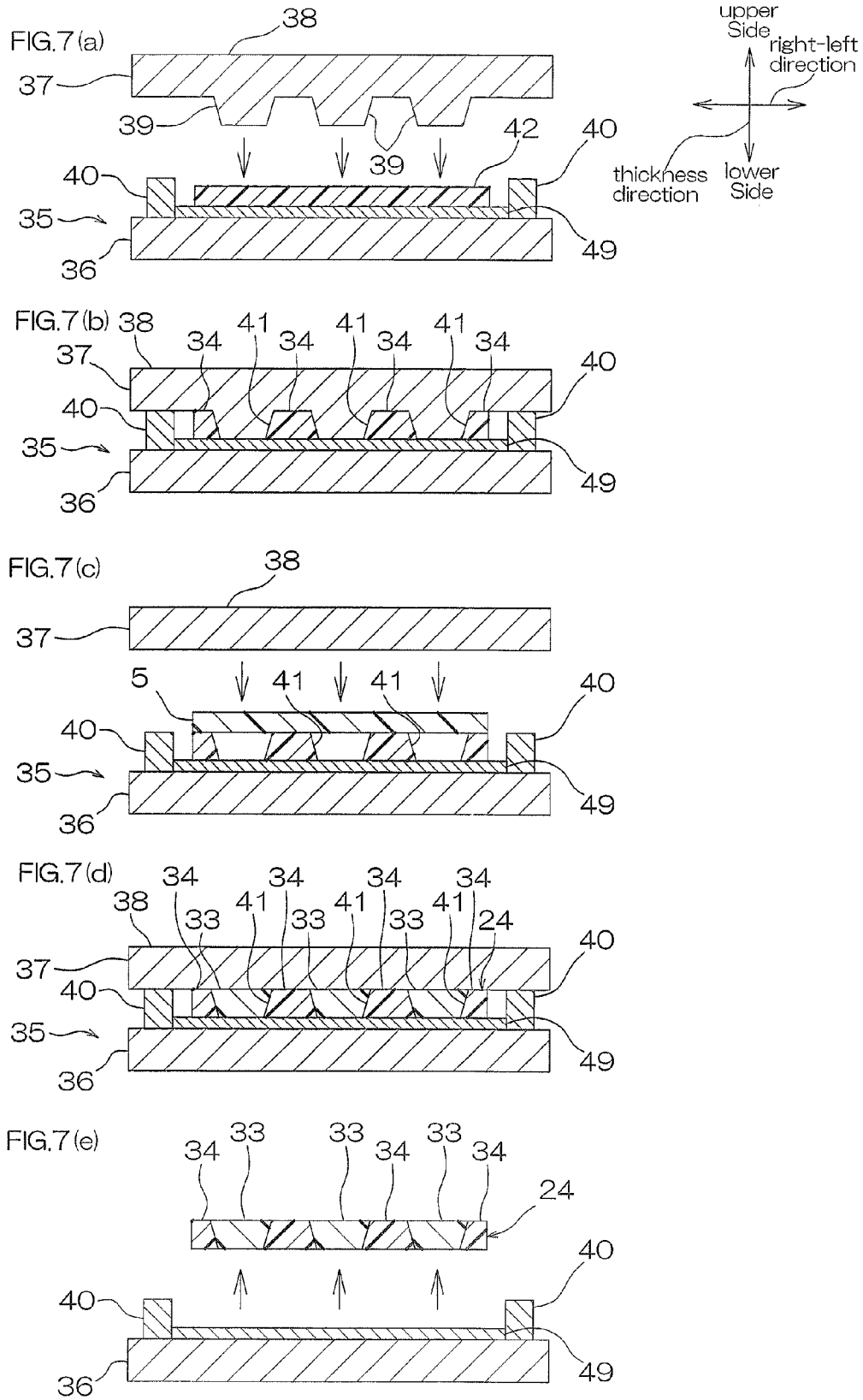
FIG. 7 shows process drawings for illustrating a method for producing the embedding-reflector sheet shown in FIG. 5 (b)

FIG. 5 shows process drawings for illustrating a fourth embodiment of a method for producing an encapsulating layer-covered semiconductor element of the present invention. FIG. 6 shows a plan view of the phosphor sheet-embedded LEDs shown in FIG. 5 (*d*). FIG. 7 shows process drawings for illustrating a method for producing the embedding-reflector sheet shown in FIG. 5 (*b*).

In the fourth embodiment, the same reference numerals are provided for members and steps corresponding to each of those in the first embodiment, and their detailed description is omitted.

In the first embodiment, as shown in FIG. 1 (*b*), the phosphor sheet 5 in which a phosphor is uniformly (uniformly at least in the plane direction) dispersed is illustrated as an encapsulating sheet that is one example of the encapsulating layer of the present invention. Alternatively, for example, as shown in FIGS. 5 (*b*) and 6, an embedding-reflector sheet 24 that includes embedding portions 33 containing a phosphor as cover portions and a reflector portion 34 surrounding the embedding portions 33 can be also illustrated as an encapsulating sheet.

As shown in FIG. 6, a plurality of the embedding portions 33 are provided at spaced intervals to each other as portions that embed a plurality of the LEDs 4 in the embedding-reflector sheet 24. Each of the embedding portions 33 is formed into a generally circular shape in plane view. To be specific, as shown in FIG. 5 (*b*), each of the embedding portions 33 is formed into a generally conical trapezoidal shape in which its width is gradually reduced toward the lower side.

The diameter (the maximum length) of the lower end portion of each of the embedding portions 33 is larger than the maximum length in the plane direction of each of the LEDs 4. To be specific, the diameter (the maximum length) of the lower end portion thereof with respect to the maximum length in the plane direction of each of the LEDs 4 is, for example, 200% or more, preferably 300% or more, or more preferably 500% or more, and is, for example, 3000% or less. To be more specific, the diameter (the maximum length) of the lower end portion of each of the embedding portions 33 is, for example, 5 mm or more, or preferably 7 mm or more, and is, for example, 300 mm or less, or preferably 200 mm or less.

The diameter (the maximum length) of the upper end portion of each of the embedding portions 33 is larger than the diameter (the maximum length) of the lower end portion thereof. To be specific, the diameter (the maximum length) of the upper end portion thereof is, for example, 7 mm or more, or preferably 10 mm or more, and is, for example, 400 mm or less, or preferably 250 mm or less.

The gap between the embedding portions 33 (the minimum gap, to be specific, the gap between the upper end portions of the embedding portions 33) is, for example, 20 mm or more, or preferably 50 mm or more, and is, for example, 1000 mm or less, or preferably 200 mm or less.

The embedding portions 33 are formed from the above-described phosphor resin composition. When the phosphor resin composition contains a curable resin, the embedding portions 33 are formed in a B-stage state.

As shown in FIG. 6, the reflector portion 34 is continuous at the circumference end portion of the embedding-reflector sheet 24 and is disposed between the embedding portions 33. The reflector portion 34 is formed into a generally grid shape in plane view surrounding each of the embedding portions 33.

The reflector portion 34 is formed from a reflecting resin composition containing a light reflecting component to be described later.

Next, a method for producing the embedding-reflector sheet 24 is described with reference to FIGS. 6 and 7.

In this method, first, as shown in FIG. 7 (*a*), a pressing device 35 is prepared.

The pressing device 35 is provided with a support board 36 and a die 37 that is disposed in opposed relation to the upper side of the support board 36.

The support board 36 is, for example, formed of a metal such as stainless steel into a generally rectangular flat plate shape.

The die 37 is, for example, formed of a metal such as stainless steel and integrally includes a flat plate portion 38 and extruded portions 39 that are formed to be extruded downwardly from the flat plate portion 38.

The flat plate portion 38 is formed into the same shape as that of the support board 36 in plane view.

In the die 37, a plurality of the extruded portions 39 are disposed at spaced intervals to each other in the plane direction so as to correspond to the embedding portions 33. That is, each of the extruded portions 39 is formed into a generally conical trapezoidal shape in which its width is gradually reduced from the lower surface of the flat plate portion 38 toward the lower side. To be specific, each of the extruded portions 39 is formed into a tapered shape in which its width is gradually reduced toward the lower side in front sectional view and side sectional view. That is, each of the extruded portions 39 is formed into the same shape as that of each of the embedding portions 33.

As shown in FIG. 7 (*a*), a spacer 40 is provided on the upper surface of the circumference end portion of the support board 36. The spacer 40 is, for example, formed of a metal such as stainless steel and is disposed so as to surround a plurality of the embedding portions 33 when projected in the thickness direction. The spacer 40 is disposed on the support board 36 so as to be included in the die 37, to be specific, to be overlapped with the circumference end portion of the flat plate portion 38, when projected in the thickness direction.

The thickness of the spacer 40 is set so as to be the total thickness of the thickness of a releasing sheet 49 to be described later and that of each of the extruded portions 39. To be specific, the thickness of the spacer 40 is, for example, 0.3 mm or more, or preferably 0.5 mm or more, and is, for example, 5 mm or less, or preferably 3 mm or less.

In the pressing device 35, the die 37 is configured to be replaceable with that having a different shape. To be specific, in the pressing device 35, the die 37 having the extruded portions 39 shown in FIG. 7 (*a*) is configured to be replaceable with the die 37 in a flat plate shape having no extruded portion 39 shown in FIG. 7 (*c*) to be described later.

As shown in FIG. 7 (*a*), the releasing sheet 49 is disposed at the inner side of the spacer 40 on the upper surface of the support board 36. The circumference end surfaces of the releasing sheet 49 are, on the upper surface of the support board 36, formed so as to be in contact with the inner side surfaces of the spacer 40. The thickness of the releasing sheet 49 is, for example, 10 μm or more, or preferably 30 μm or more, and is, for example, 200 μm or less, or preferably 150 μm or less.

Next, in the pressing device 35 shown in FIG. 7 (*a*), a reflector sheet 42 is disposed on the upper surface of the releasing sheet 49.

In order to dispose the reflector sheet 42 on the upper surface of the releasing sheet 49, for example, the following method is used: that is, a laminating method in which the reflector sheet 42 formed from a reflecting resin composition is laminated on the upper surface of the releasing sheet 49 or an application method in which a liquid reflecting resin composition is applied to the upper surface of the releasing sheet 49.

The reflecting resin composition contains, for example, a resin and a light reflecting component.

An example of the resin includes a thermosetting resin such as a thermosetting silicone resin, an epoxy resin, a thermosetting polyimide resin, a phenol resin, a urea resin, a melamine resin, an unsaturated polyester resin, a diallyl phthalate resin, and a thermosetting urethane resin. Preferably, a thermosetting silicone resin and an epoxy resin are used.

The light reflecting component is, for example, a white compound. To be specific, an example of the white compound includes a white pigment.

An example of the white pigment includes a white inorganic pigment. Examples of the white inorganic pigment include an oxide such as a titanium oxide, a zinc oxide, and a zirconium oxide; a carbonate such as white lead (lead carbonate) and calcium carbonate; and a clay mineral such as kaolin (kaolinite).

As the white inorganic pigment, preferably, an oxide is used, or more preferably, a titanium oxide is used.

To be specific, the titanium oxide is $TiO_2$ (titanium oxide (IV), titanium dioxide).

A crystal structure of the titanium oxide is not particularly limited. Examples of the crystal structure thereof include a rutile type, a brookite type (pyromelane), and an anatase type (octahedrite). Preferably, a rutile type is used.

A crystal system of the titanium oxide is not particularly limited. Examples of the crystal system thereof include a tetragonal system and an orthorhombic system. Preferably, a tetragonal system is used.

When the crystal structure and the crystal system of the titanium oxide are the rutile type and the tetragonal system, respectively, it is possible to effectively prevent a reduction of the reflectivity with respect to light (to be specific, visible light, among all, the light around the wavelength of 450 nm) even in a case where the reflector portion 34 is exposed to a high temperature for a long time.

The light reflecting component is in the form of a particle. The shape thereof is not limited and examples of the shape thereof include a sphere shape, a plate shape, and a needle shape. The average value of the maximum length (in the case of a sphere shape, the average particle size) of the light reflecting component is, for example, 1 nm or more and 1000 nm or less. The average value of the maximum length is measured using a laser diffraction scattering particle size analyzer.

The mixing ratio of the light reflecting component with respect to 100 parts by mass of the resin is, for example, 0.5 parts by mass or more, or preferably 1.5 parts by mass or more, and is, for example, 90 parts by mass or less, or preferably 70 parts by mass or less.

The above-described light reflecting component is uniformly dispersed and mixed in the resin.

Also, the above-described filler can be further added to the reflecting resin composition. That is, the filler can be used in combination with the light reflecting component (to be specific, a white pigment).

An example of the filler includes a known filler excluding the above-described white pigment. To be specific, examples of the filler include organic microparticles such as silicone particles and inorganic microparticles such as silica, talc, alumina, aluminum nitride, and silicon nitride.

The addition ratio of the filler is adjusted so that the total amount of the filler and the light reflecting component with respect to 100 parts by mass of the resin is, for example, 10 parts by mass or more, preferably 25 parts by mass or more, or more preferably 40 parts by mass or more, and is, for example, 80 parts by mass or less, preferably 75 parts by mass or less, or more preferably 60 parts by mass or less.

In the laminating method, the reflecting resin composition is prepared in an A-stage state by blending the above-described resin and light reflecting component, and the filler, which is added as required, to be uniformly mixed.

Subsequently, in the laminating method, the reflecting resin composition in an A-stage state is applied to the surface of a release sheet that is not shown by an application method such as a casting, a spin coating, or a roll coating and thereafter, the applied product is heated to be brought into a B-stage state or C-stage state. An example of the release sheet includes the same one as the above-described release sheet 13.

Alternatively, for example, the reflecting resin composition in an A-stage state is applied to the surface of a release sheet that is not shown using a screen printing or the like by the above-described application method and thereafter, the applied product is heated to form the reflector sheet 42 in a B-stage state or C-stage state.

Thereafter, the reflector sheet 42 is transferred onto the releasing sheet 49. Subsequently, the release sheet that is not shown is peeled off.

On the other hand, in the application method, the above-described reflecting resin composition in an A-stage state is applied to the upper surface of the releasing sheet 49 using a screen printing or the like and thereafter, the applied product is heated to form the reflector sheet 42 in a B-stage state.

The thickness of the reflector sheet 42 is, for example, 0.3 mm or more, or preferably 0.5 mm or more, and is, for example, 5 mm or less, or preferably 3 mm or less.

Subsequently, as shown by the arrows in FIG. 7 (*a*), and in FIG. 7 (*b*), the reflector sheet 42 is pressed by the pressing device 35.

To be specific, the die 37 is pushed down with respect to the support board 36. To be more specific, the die 37 is pushed downwardly so that the extruded portions 39 pass through the reflector sheet 42 in the thickness direction. Along with this, the circumference end portion of the flat plate portion 38 in the die 37 is brought into contact with the upper surface of the spacer 40.

In this way, as shown in FIG. 7 (*b*), in the reflector sheet 42, through holes 41, which pass through the reflector sheet 42 in the thickness direction and are in shapes corresponding to the extruded portions 39, are formed.

In the pushing down of the die 37, when the reflecting resin composition contains a thermosetting resin in a B-stage state, a heater (not shown) is built in the die 37 in advance and the reflector sheet 42 can be also heated by the heater. In this way, the reflecting resin composition is completely cured (is brought into a C-stage state).

The heating temperature is, for example, 80° C. or more, or preferably 100° C. or more, and is, for example, 200° C. or less, or preferably 180° C. or less.

In this way, the reflector portion 34 is formed on the releasing sheet 49.

Thereafter, as shown in FIG. 7 (*c*), a pressing state of the pressing device 35 is released. To be specific, the die 37 is pulled up.

Subsequently, the die 37 including the flat plate portion 38 and the extruded portions 39 is replaced with the die 37 including the flat plate portion 38 only.

Along with this, the phosphor sheet 5 is disposed on the reflector portion 34.

To be specific, the phosphor sheet 5 is disposed on the upper surface of the reflector portion 34 so as to cover the through holes 41.

When the phosphor resin composition contains a curable resin, the phosphor sheet 5 in a B-stage state is disposed on the reflector portion 34. The phosphor sheet 5 in a B-stage state can retain its flat plate shape to some extent, so that it is disposed on the upper surface of the reflector portion 34 so as to cover the through holes 41 without falling into the inside of the through holes 41.

The phosphor sheet 5 is formed to be more flexible than the reflector portion 34 (to be specific, the reflector portion 34 in a C-stage state when the reflecting resin composition of the reflector sheet 42 contains a curable resin). To be specific, the reflector portion 34 is formed to have non-deformable hardness by the next pressing (ref: FIG. 7 (d)), while the phosphor sheet 5 is formed to have deformable flexibility by the next pressing.

Next, as shown in FIG. 7 (d), the phosphor sheet 5 is pressed by the pressing device 35. To be specific, the die 37 made of the flat plate portion 38 is pushed down toward the support board 36. Along with this, the circumference end portion of the flat plate portion 38 is brought into contact with the upper surface of the spacer 40. The lower surface of the flat plate portion 38 is in contact with the upper surface of the reflector portion 34.

In this way, the relatively flexible phosphor sheet 5 is pressed from the upper side by the flat plate portion 38 to fill the through holes 41. On the other hand, the relatively hard reflector portion 34 is not deformed and houses the embedding portions 33 in the through holes 41 therein.

When the curable resin is a thermosetting resin, the phosphor sheet 5 can be heated by a heater that is built in the flat plate portion 38.

In this way, the embedding portions 33 are formed in the through holes 41 in the reflector portion 34.

In this way, the embedding-reflector sheet 24 including the embedding portions 33 and the reflector portion 34 is obtained between the support board 36 and the die 37.

Thereafter, as shown in FIG. 7 (e), the die 37 is pulled up and subsequently, the embedding-reflector sheet 24 is peeled from the releasing sheet 49.

Next, using the embedding-reflector sheet 24 shown in FIG. 7 (e), a method for producing the phosphor sheet-covered LED 10 and the LED device 15, which has different steps from those in the above-described embodiment, is described in detail with reference to FIG. 5.

[Sheet Disposing Step]

As shown by the upper side view in FIG. 5 (b), the embedding-reflector sheet 24 is disposed above the support sheet 1 so that each of the embedding portions 33 is formed into a tapered shape in which its width is gradually reduced toward the lower side.

That is, each of a plurality of the embedding portions 33 is disposed in opposed relation to each of a plurality of the LEDs 4. To be specific, each of the embedding portions 33 is disposed to be opposed to the center of each of the LEDs 4 and each of the LEDs 4 is also disposed at spaced intervals to the inner side of the reflector portion 34 in plane view.

Subsequently, as shown in FIG. 5 (c), the embedding-reflector sheet 24 is pressed. In this way, each of the LEDs 4 is embedded in each of the embedding portions 33 so that the upper surface and the side surfaces of the LED 4 are covered with the embedding portion 33.

[Encapsulating Step]

As shown in FIG. 5 (d), in the encapsulating step, when the phosphor resin composition contains a curable resin, the phosphor sheet 5 is cured. In this way, the embedding portions 33 are completely cured. In this way, each of the LEDs 4 is encapsulated by each of the embedding portions 33.

[Cutting Step]

As shown by the dashed lines in FIG. 5 (d), in the cutting step, the reflector portion 34 is cut along the thickness direction. As shown by the dash-dot lines in FIG. 6, for example, the phosphor sheet 5 is cut so that the reflector portion 34 is formed into a generally rectangular shape in plane view that surrounds each of the embedding portions 33.

By the cutting step, the phosphor sheet-covered LEDs 10, each of which includes one LED 4, the embedding portion 33 that embeds the LED 4, and the reflector portion 34 that is provided around the embedding portion 33, are obtained in a state of being in close contact with the support sheet 1. That is, each of the phosphor sheet-covered LEDs 10 includes the reflector portion 34. That is, the phosphor sheet-covered LED 10 is a reflector portion-including phosphor sheet-covered LED 10.

[LED Peeling Step]

In the LED peeling step, as shown in FIG. 5 (e), each of the phosphor sheet-covered LEDs 10 each including the reflector portion 34 is peeled from the support sheet 1.

[Mounting Step]

In the mounting step, after the phosphor sheet-covered LED 10 including the reflector portion 34 is selected in accordance with emission wavelength and luminous efficiency, as shown in FIG. 5 (f), the selected phosphor sheet-covered LED 10 is mounted on the board 9. In this way, the LED device 15 is obtained.

In this way, the LED device 15 including the board 9 and the phosphor sheet-covered LED 10 that is mounted on the board 9 and includes the reflector portion 34 is obtained.

According to the fourth embodiment, the embedding-reflector sheet 24 includes the embedding portion 33 that embeds the LED 4 and the reflector portion 34 that contains a light reflecting component and is formed so as to surround the embedding portion 33, so that light emitted from the LED 4 can be reflected by the reflector portion 34. Thus, the luminous efficiency of the LED device 15 can be improved.

Modified Example

In the fourth embodiment, the embedding portion 33 is formed from a phosphor resin composition that contains a phosphor. Alternatively, for example, the embedding portion 33 can be also formed from an encapsulating resin composition that does not contain a phosphor.

Also, the release sheet 13 (ref: the phantom lines in FIG. 5 (b)) is provided between the flat plate portion 38 and the phosphor sheet 5 that are shown in FIG. 7 (c) to form the embedding-reflector sheet 24 in which the release sheet 13 is laminated on the upper surface thereof. Thereafter, as shown by the phantom lines in FIG. 5 (c), the embedding-reflector sheet 24 can be also, for example, subjected to flat plate pressing with respect to a plurality of the LEDs 4 and the support sheet 1.

Fifth Embodiment

FIG. 8 shows process drawings for illustrating a method for producing an embedding-reflector sheet used in a fifth embodiment of a method for producing an encapsulating layer-covered semiconductor element of the present invention.

In the fifth embodiment, the same reference numerals are provided for members and steps corresponding to each of those in the fourth embodiment, and their detailed description is omitted.

In the method for producing the embedding-reflector sheet 24 in the fourth embodiment, as shown in FIGS. 7 (c) and 7 (d), the embedding portions 33 are formed of the phosphor sheet 5. Alternatively, for example, as shown in FIG. 8 (c), the embedding portions 33 can be also formed by potting a varnish of a phosphor resin composition into the through holes 41 without using the phosphor sheet 5.

To be specific, first, the phosphor resin composition is prepared as a varnish. To be specific, when the phosphor resin composition contains a curable resin, a varnish in an A-stage state is prepared. In this way, the phosphor resin composition in an A-stage state fills the through holes 41.

Thereafter, when the phosphor resin composition contains a curable resin, the phosphor resin composition in an A-stage state is brought into a B-stage state.

In the fifth embodiment, the same function and effect as that of the fourth embodiment can be achieved.

Sixth Embodiment

FIG. 9 shows process drawings for illustrating a sixth embodiment of a method for producing an encapsulating layer-covered semiconductor element of the present invention.

In the sixth embodiment, the same reference numerals are provided for members and steps corresponding to each of those in the fourth and fifth embodiments, and their detailed description is omitted.

In the fourth embodiment, as shown in FIGS. 5 (b) and 6, the lower end portion of the embedding portion 33 is formed to be larger than the LED 4 in plane view. Alternatively, for example, as shown in FIG. 9 (b), the lower end portion of the embedding portion 33 can be formed to be the same size as that of the LED 4.

[LED Disposing Step]

Each of the embedding portions 33 is, for example, formed into a generally quadrangular pyramid trapezoidal shape in which its width is gradually reduced toward the lower side.

In order to form the embedding portions 33 shown in FIG. 9 (b), each of the extruded portions 39 referred in FIGS. 7 and 8 is formed into a generally quadrangular pyramid trapezoidal shape in which its width is gradually reduced from the lower surface of the flat plate portion 38 toward the lower side.

Also, as shown by the dash-dot lines in FIG. 9 (b), the embedding-reflector sheet 24 is disposed on the pressure-sensitive adhesive layer 3 including the LEDs 4 so that, when projected in the thickness direction, the lower end portion of each of the embedding portions 33 is overlapped with each of the LEDs 4, to be specific, the circumference end edge of the lower end portion of each of the embedding portions 33 is formed at the same position as the circumference end edge of each of the LEDs 4 in plane view.

In the sixth embodiment, the same function and effect as those of the fourth and fifth embodiments can be achieved.

Seventh Embodiment

Figure 10:
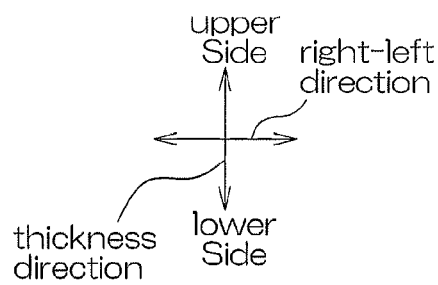
FIG. 10 shows process drawings for illustrating a seventh embodiment of a method for producing an encapsulating layer-covered semiconductor element of the present invention.
Figure 10A:
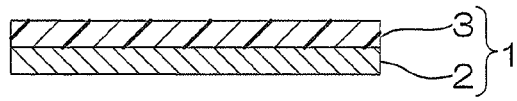
Figure 10B:
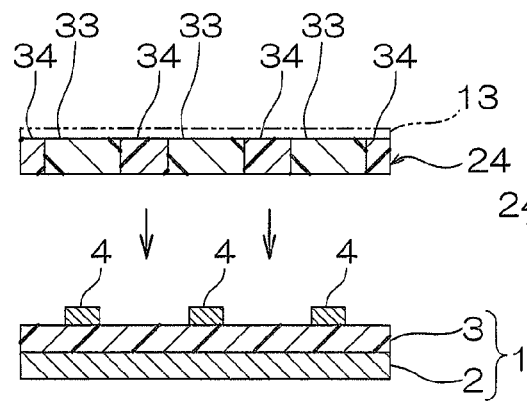
Figure 10C:
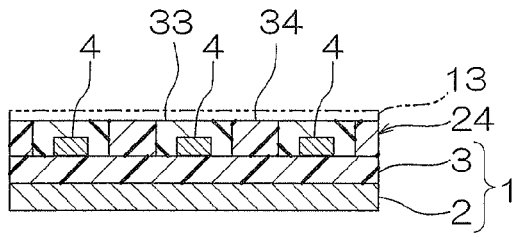
Figure 10D:
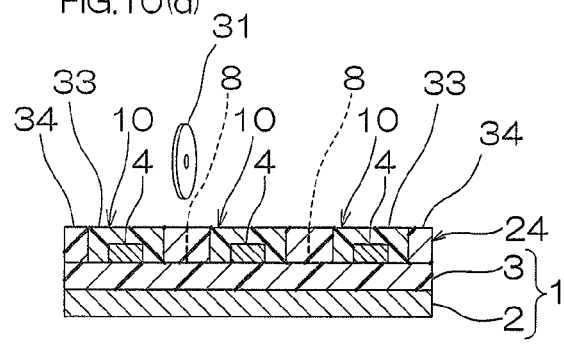
Figure 10E:
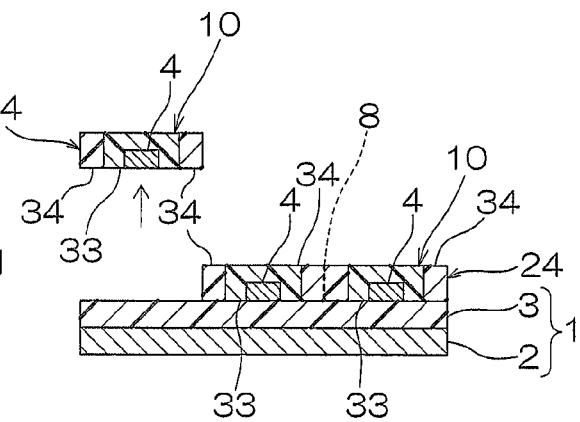
Figure 10F:
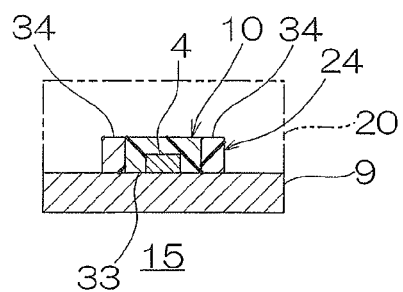

FIG. 10 shows process drawings for illustrating a seventh embodiment of a method for producing an encapsulating layer-covered semiconductor element of the present invention. FIG. 11 shows process drawings for illustrating a method for producing the embedding-reflector sheet shown in FIG. 10 (b).

In the seventh embodiment, the same reference numerals are provided for members and steps corresponding to each of those in the fourth embodiment, and their detailed description is omitted.

In the fourth embodiment, as shown in FIG. 5 (b), each of the embedding portions 33 in the embedding-reflector sheet 24 is formed into a generally conical trapezoidal shape in which its width is gradually reduced toward the lower side. Alternatively, for example, as shown in FIG. 10 (b), each of the embedding portions 33 can be also formed into a generally column shape extending in the up-down direction (the thickness direction).

In order to form the embedding portions 33, a punching device 55 shown in FIGS. 11 (a) and 11 (b) is used.

The punching device 55 is provided with a support board 56 and a die 57 that is disposed in opposed relation to the upper side of the support board 56.

The support board 56 is, for example, formed of a metal such as stainless steel into a generally rectangular flat plate shape. Through holes 53 that pass through the support board 56 in the thickness direction are formed.

Each of the through holes 53 is formed into a generally circular shape in plane view.

The die 57 integrally includes a flat plate portion 58 and extruded portions 59 that are formed to be extruded downwardly from the flat plate portion 58.

The flat plate portion 58 is formed into the same shape as that of the flat plate portion 38 shown in FIG. 7 (a).

In the die 57, a plurality of the extruded portions 59 are disposed at spaced intervals to each other in the plane direction so as to correspond to the embedding portions 33 (ref: FIG. 11 (d)). That is, each of the extruded portions 59 is formed into the same shape and the same size as those of each of the through holes 53 in plane view, to be specific, into a generally column shape. Each of the extruded portions 59 is formed into the same shape as that of each of the embedding portions 33 (ref: FIG. 11 (d)). That is, each of the extruded portions 59 is formed into a generally rectangular shape in front sectional view and side sectional view.

In this way, the punching device 55 is configured to allow the extruded portions 59 to be capable of being inserted into the through holes 53 by the pushing down of the die 57.

The hole diameter of each of the through holes 53 and the diameter of each of the extruded portions 59 are, for example, 5 mm or more, or preferably 7 mm or more, and are, for example, 300 mm or less, or preferably 200 mm or less.

The spacer 40 is provided on the upper surface of the circumference end portion of the support board 56. The spacer 40 is, in plane view, disposed in a generally frame shape in plane view at the circumference end portion of the support board 56 so as to surround the through holes 53.

In order to form the embedding-reflector sheet 24 by the punching device 55 shown in FIGS. 11 (a) and 11 (b), first, as shown in FIG. 11 (a), the reflector sheet 42 is disposed on the support board 56. To be specific, the reflector sheet 42 is disposed on the upper surface of the support board 56 so as to cover a plurality of the through holes 53.

Next, as shown in FIG. 11 (b), the reflector sheet 42 is stamped out using the punching device 55.

To be specific, the extruded portions 59 stamp out the reflector sheet 42 by pushing down the die 57.

In this way, the through holes 41 in shapes corresponding to the extruded portions 59 are formed in the reflector sheet 42.

In this way, the reflector portion 34 is formed on the support board 56.

Next, as shown in FIG. 11 (c), the die 57 is pulled up.

Thereafter, the formed reflector portion 34 is disposed in the pressing device 35 that is provided with the support board 36 and the die 37 made of the flat plate portion 38, and includes the releasing sheet 49.

Next, the phosphor sheet 5 is disposed on the reflector portion 34.

Next, as shown by the arrows in FIG. 11 (c), and in FIG. 11 (d), the phosphor sheet 5 is pressed by the pressing device 35. In this way, the embedding portions 33 are formed in the inside of the through holes 41 in the reflector portion 34.

In this way, the embedding-reflector sheet 24 including the embedding portions 33 and the reflector portion 34 is obtained between the support board 36 and the die 37.

Thereafter, the die 37 is pulled up and subsequently, as shown in FIG. 11 (e), the embedding-reflector sheet 24 is peeled from the releasing sheet 49.

In the seventh embodiment, the same function and effect as that of the fourth embodiment can be achieved.

Eighth Embodiment

FIG. 12 shows process drawings for illustrating a method for producing an embedding-reflector sheet used in an eighth embodiment of a method for producing an encapsulating layer-covered semiconductor element of the present invention.

In the eighth embodiment, the same reference numerals are provided for members and steps corresponding to each of those in the seventh embodiment, and their detailed description is omitted.

In the method for producing the embedding-reflector sheet 24 in the seventh embodiment, as shown in FIGS. 11 (c) and 11 (d), the embedding portions 33 are formed of the phosphor sheet 5. Alternatively, for example, as shown in FIG. 12 (c), the embedding portions 33 can be also formed by potting a varnish of a phosphor resin composition into the through holes 41 without using the phosphor sheet 5.

To be specific, the reflector portion 34 shown in FIG. 12 (b) is taken out from the punching device 55 to be subsequently, as shown in FIG. 12 (c), disposed on the upper surface of the releasing sheet 49. Then, the varnish of the phosphor resin composition is potted into the through holes 41.

In the eighth embodiment, the same function and effect as that of the seventh embodiment can be achieved.

Ninth Embodiment

FIG. 13 shows process drawings for illustrating a ninth embodiment of a method for producing an encapsulating layer-covered semiconductor element of the present invention.

In the ninth embodiment, the same reference numerals are provided for members and steps corresponding to each of those in the seventh embodiment, and their detailed description is omitted.

In the seventh embodiment, as shown in FIG. 10 (c), the embedding portions 33 that embed the LEDs 4 are illustrated as cover portions. Alternatively, for example, as shown in FIG. 13 (c), cover portions 43 that cover the upper surfaces of the LEDs 4 can be also illustrated.

As shown in FIG. 13 (b), the cover portions 43 are provided in a cover-reflector sheet 44 so as to be surrounded by the reflector portion 34. In the cover-reflector sheet 44, each of the cover portions 43 is formed into the same shape as that of each of the embedding portions 33 shown in FIG. 10 (b) and furthermore, is formed into the same size as that of each of the LEDs 4.

As shown in FIG. 13 (b), for example, each of the cover portions 43 is disposed on the upper surface of each of the LEDs 4 so that each of the cover portions 43 is overlapped with each of the LEDs 4 when projected in the thickness direction, to be specific, the circumference end edge of each of the cover portions 43 is formed at the same position as the circumference end edge of each of the LEDs 4 in plane view.

[Covering Step]

In the ninth embodiment, the covering step shown in FIG. 13 (c) is performed instead of the embedding step in the sheet disposing step shown in FIG. 10 (c). The conditions of the covering step are the same as those of the embedding step.

In the covering step shown in FIG. 13 (c), each of the cover portions 43 covers the upper surface of each of the LEDs 4. The LED 4 is pressed into the cover portion 43 by pressing of the LED 4, so that the cover portion 43 slightly expands outwardly in the plane direction. The degree of expansion thereof is subtle, so that in FIG. 13 (c), the lengths in the right-left direction of the cover portion 43 and the LED 4 after the pressing are shown to be the same.

[Curing Step]

In the ninth embodiment, the curing step shown in FIG. 13 (d) is performed instead of the encapsulating step shown in FIG. 10 (d).

In the curing step, the cover portions 43 are cured. The conditions of the curing step are the same as those of the above-described encapsulating step.

In the ninth embodiment, the same function and effect as that of the seventh embodiment can be achieved.

Tenth Embodiment

FIG. 14 shows process drawings for illustrating a tenth embodiment of a method for producing an encapsulating layer-covered semiconductor element of the present invention.

In the tenth embodiment, the same reference numerals are provided for members and steps corresponding to each of those in the first embodiment, and their detailed description is omitted.

In the first embodiment, as shown in FIG. 1 (c), in the sheet disposing step, the embedding step in which the side surfaces and the upper surfaces of the LEDs 4 are covered with the phosphor sheet 5 is performed. Alternatively, for example, as shown in FIG. 14 (c), the covering step in which the side surfaces only of the LEDs 4 are covered with the phosphor sheet 5 can be performed instead of the embedding step. Also, the curing step can be performed instead of the encapsulating step.

[Sheet Disposing Step]

As shown in FIG. 14 (b), the thickness of the prepared phosphor sheet 5 is set to be thinner than that of each of the LEDs 4, that is, set to be, for example, 95% or less, or preferably 90% or less, and to be, for example, 10% or more with respect to the thickness of each of the LEDs 4. To be specific, the thickness of the phosphor sheet 5 is set to be, for example, 1000 μm or less, or preferably 800 μm or less, and to be, for example, 30 μm or more, or preferably 50 μm or more.

As shown in FIG. 14 (c), in the covering step, a laminate (ref: the upper side view in FIG. 14 (b)) made of the release sheet 13 and the phosphor sheet 5 laminated on the lower surface of the release sheet 13 is pressed into the support sheet 1 including the LEDs 4 so that the lower surface of the release sheet 13 is in contact with the upper surfaces of the LEDs 4 by the pressing.

The upper surface of the phosphor sheet 5, which is pressed into gaps between a plurality of the LEDs 4, is formed to be flush with the upper surfaces of the LEDs 4. The lower surface of the phosphor sheet 5 is also formed to be flush with the lower surfaces of the LEDs 4. That is, the thickness of the phosphor sheet 5, which is pressed into gaps between a plurality of the LEDs 4, is the same as that of each of the LEDs 4.

The side surfaces of the LED 4 are covered with the phosphor sheet 5, while both a bump that forms a portion of the lower surface of the LED 4 and the upper surface of the LED 4 are exposed from the phosphor sheet 5.

[Curing Step]

In the curing step, the phosphor sheet 5 is cured. The conditions of the curing step are the same as those of the above-described encapsulating step.

[Cutting Step]

As shown by the dashed lines in FIG. 14 (d), the phosphor sheet 5 is cut, while the position of the LEDs 4 is checked from the upper side. To be specific, in the phosphor sheet 5, the position of the LEDs 4 is checked, while the LEDs 4 are visually confirmed from the upper side with, for example, a camera. As referred in the dashed lines in FIG. 6, the phosphor sheet 5 is cut so that the cuts 8 that define a region surrounding each of the LEDs 4 are formed in plane view.

The phosphor sheet 5 can be also cut, while the LEDs 4 are visually confirmed, in addition, with the reference marks 18 (ref: FIG. 2) as a reference.

[LED Peeling Step]

In FIG. 14 (e), in the LED peeling step, each of the phosphor sheet-covered LEDs 10 is peeled from the upper surface of the pressure-sensitive adhesive layer 3. That is, each of the phosphor sheet-covered LEDs 10 is peeled from the support board 2 and the pressure-sensitive adhesive layer 3 so that interfacial peeling occurs between the phosphor sheet 5 and the LEDs 4, and the pressure-sensitive adhesive layer 3.

In the tenth embodiment, the same function and effect as that of the first embodiment can be achieved.

In addition, in the covering step, the side surfaces of the LEDs 4 are covered with the phosphor sheet 5 so that at least the upper surfaces of the LEDs 4 are exposed from the phosphor sheet 5. Thus, in the cutting step after the sheet disposing step, the LEDs 4 having the upper surfaces exposed are visually confirmed and the phosphor sheet 5 can be accurately cut corresponding to the LEDs 4. Therefore, the phosphor sheet-covered LED 10 to be obtained has excellent size stability. As a result, the LED device 15 including the phosphor sheet-covered LED 10 has excellent luminous stability.

Eleventh Embodiment

Figure 15:
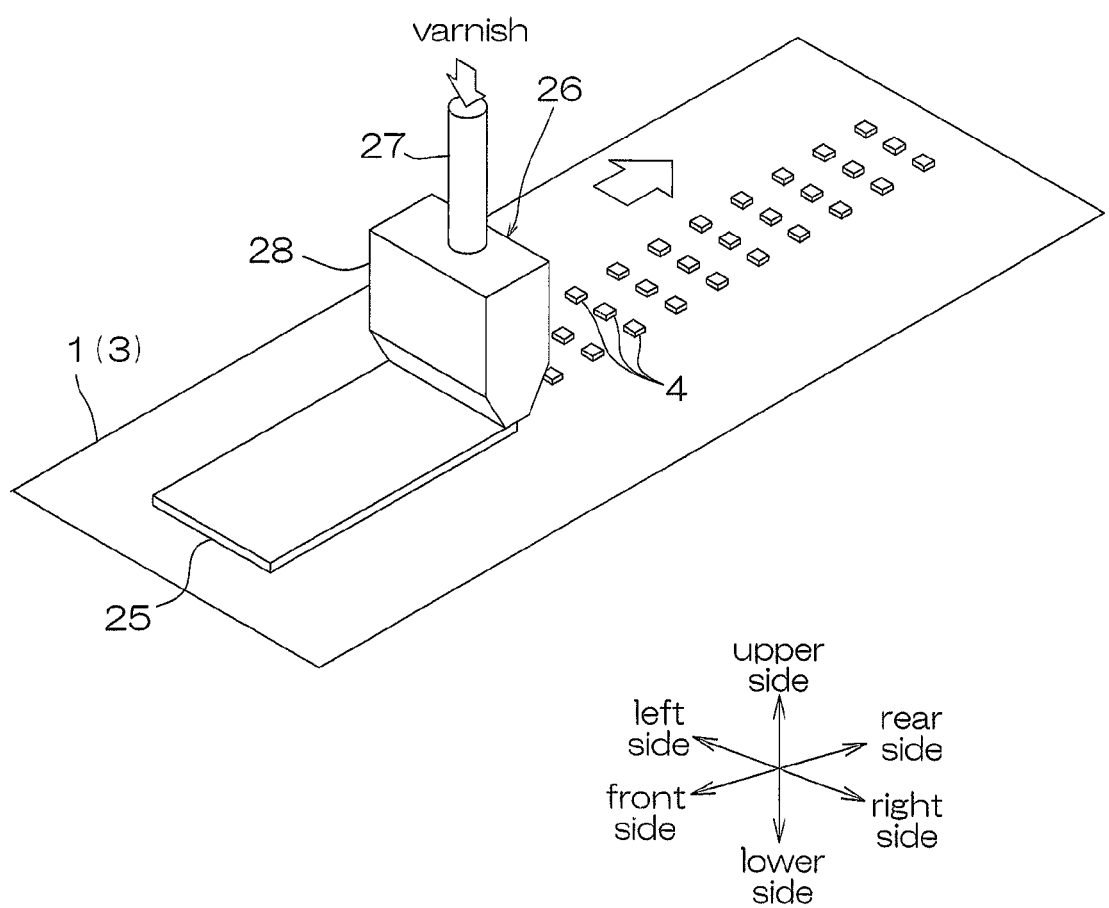
FIG. 15 shows a perspective view of a dispenser used in an eleventh embodiment of a method for producing an encapsulating layer-covered semiconductor element of the present invention.

FIG. 15 shows a perspective view of a dispenser used in an eleventh embodiment of a method for producing an encapsulating layer-covered semiconductor element of the present invention.

In the eleventh embodiment, the same reference numerals are provided for members and steps corresponding to each of those in the first embodiment, and their detailed description is omitted.

In the first embodiment, as shown in FIG. 1 (b), in the sheet disposing step that is one example of the layer disposing step of the present invention, the phosphor sheet 5 that is formed in advance is illustrated as a phosphor layer that is one example of the encapsulating layer of the present invention. Alternatively, as referred in FIG. 15, for example, a phosphor resin composition is prepared as a varnish and the varnish is directly applied onto the support sheet 1 so as to cover a plurality of the LEDs 4, so that a phosphor layer 25 as an encapsulating layer can be also formed. That is, the phosphor layer 25 can be formed from the varnish of the phosphor resin composition.

In order to form the phosphor layer 25, first, the varnish is applied onto the support sheet 1 so as to cover the LEDs 4.

In order to apply the varnish, for example, an application device such as a dispenser, an applicator, or a slit die coater is used. Preferably, a dispenser 26 shown in FIG. 15 is used.

As shown in FIG. 15, the dispenser 26 integrally includes an introduction portion 27 and an application portion 28.

The introduction portion 27 is formed into a generally cylindrical shape extending in the up-down direction and the lower end portion thereof is connected to the application portion 28.

The application portion 28 is formed into a flat plate shape extending in the right-left and the up-down directions. The application portion 28 is formed into a generally rectangular shape in side view that is long in the up-down direction. The introduction portion 27 is connected to the upper end portion of the application portion 28. The lower end portion of the application portion 28 is formed into a tapered shape in sectional side view in which the front end portion and the rear end portion are cut off. The lower end surface of the application portion 28 is configured to be capable of being pressed with respect to the upper surface of the pressure-sensitive adhesive layer 3 and the upper surfaces of the LEDs 4. Furthermore, at the inside of the application portion 28, a broad flow path (not shown) in which a varnish introduced from the introduction portion 27 gradually expands in the right-left direction as it goes toward the lower section (downwardly) is provided.

The dispenser 26 is configured to be movable relatively in the front-rear direction with respect to the support sheet 1 extending in the plane direction.

In order to apply the varnish to the support sheet 1 using the dispenser 26, the application portion 28 is disposed in opposed relation (pressed) to the upper surfaces of a plurality of the LEDs 4 and the varnish is supplied to the introduction portion 27. Along with this, the dispenser 26 is moved relatively toward the rear side with respect to a plurality of the LEDs 4. In this way, the varnish is introduced from the introduction portion 27 into the application portion 28 and subsequently, is broadly supplied from the lower end portion of the application portion 28 to the support sheet 1 and the LEDs 4. By the relative movement of the dispenser 26 toward the rear side with respect to a plurality of the LEDs 4, the varnish is applied onto the upper surface of the support sheet 1 in a belt shape extending in the front-rear direction so as to cover a plurality of the LEDs 4.

When the phosphor resin composition contains a curable resin, the varnish is prepared in an A-stage state. When the varnish is, for example, supplied from the application portion 28 to the support sheet 1, it does not flow out of its position outwardly in the plane direction. That is, the varnish has viscous properties of keeping its position. To be specific, the viscosity of the varnish under conditions of 25° C. and 1 pressure is, for example, 1,000 mPa·s or more, or preferably 4,000 mPa·s or more, and is, for example, 1,000,000 mPa·s or less, or preferably 100,000 mPa·s or less. The viscosity is measured by adjusting a temperature of the varnish to 25° C. and using an E-type cone at a number of revolutions of 99 s$^{-1}$.

When the viscosity of the varnish is not less than the above-described lower limit, the varnish can be effectively prevented from flowing outwardly in the plane direction. Thus, it is not required to separately provide a dam member or the like in the support sheet 1 (to be specific, around a plurality of the LEDs 4), so that a simplified process can be achieved. Then, the varnish can be easily and surely applied to the support sheet 1 with a desired thickness and a desired shape with the dispenser 26.

On the other hand, when the viscosity of the varnish is not more than the above-described upper limit, the application properties (the handling ability) can be improved.

Thereafter, when the phosphor resin composition contains a curable resin, the applied varnish is brought into a B-stage state (a semi-cured state).

In this way, the phosphor layer 25 in a B-stage state is formed on the support sheet 1 (on the upper surface of the pressure-sensitive adhesive layer 3) so as to cover a plurality of the LEDs 4.

In the eleventh embodiment, the same function and effect as that of the first embodiment can be achieved.

Modified Example

In the first to eleventh embodiments, a plurality of the LEDs 4 are covered with the phosphor sheet 5. Alternatively, for example, a single piece of the LED 4 can be covered with the phosphor sheet 5.

In such a case, to be specific, in the cutting step shown in FIG. 1 (d) that is illustrated in the first embodiment, the phosphor sheet 5 around the LED 4 is trimmed (subjected to trimming) so as to have a desired size.

In the first to tenth embodiments, the LED 4, the phosphor sheet 5, the phosphor sheet-covered LED 10, and the LED device 15 are described as one example of the semiconductor element, the encapsulating layer, the encapsulating layer-covered semiconductor element, and the semiconductor device of the present invention, respectively. Alternatively, for example, though not shown, the semiconductor element, the encapsulating layer, the encapsulating layer-covered semiconductor element, and the semiconductor device of the present invention can also include an electronic element, an encapsulating sheet, an encapsulating layer-covered electronic element, and an electronic device, respectively.

The electronic element is a semiconductor element that converts electrical energy to energy other than light, to be specific, to signal energy or the like. Examples thereof include a transistor and a diode. The size of the electronic element is appropriately selected in accordance with its use and purpose.

The encapsulating sheet is formed from an encapsulating resin composition that contains a curable resin as an essential component and a filler as an optional component. An example of the filler further includes a black pigment such as carbon black. The mixing ratio of the filler with respect to 100 parts by mass of the curable resin is, for example, 5 parts by mass or more, or preferably 10 parts by mass or more, and is, for example, 99 parts by mass or less, or preferably 95 parts by mass or less.

The encapsulating sheet is, as illustrated in FIG. 1 (d) in the first embodiment or the like, cut so as to correspond to each of the electronic elements as a protective layer covering the electronic elements (to be specific, at least the side surfaces of the electronic elements).

The properties other than light transmission properties (to be specific, compressive elastic modulus and the like) of the encapsulating sheet are the same as those of the phosphor sheet 5 in the first to tenth embodiments.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing an encapsulating layer-covered semiconductor element comprising:
   a preparing step of preparing a support sheet including a hard support board;
   a semiconductor element disposing step of disposing a semiconductor element at one side in a thickness direction of the support sheet;
   a layer disposing step of, after the semiconductor element disposing step, disposing an encapsulating layer containing a phosphor layer formed from a phosphor resin composition containing a curable resin and a phosphor at the one side in the thickness direction of the support sheet so as to cover the semiconductor element;
   an encapsulating step of curing the encapsulating layer to encapsulate the semiconductor element by the encapsulating layer that is flexible;
   a cutting step of, after the encapsulating step, cutting the encapsulating layer that is flexible corresponding to the semiconductor element to produce an encapsulating layer-covered semiconductor element including the semiconductor element and the encapsulating layer covering the semiconductor element; and
   a semiconductor element peeling step of, after the cutting step, peeling the encapsulating layer-covered semiconductor element from the support sheet.

2. The method for producing an encapsulating layer-covered semiconductor element according to claim 1, wherein the encapsulating layer is formed of an encapsulating sheet.

3. The method for producing an encapsulating layer-covered semiconductor element according to claim 1, wherein
   in the layer disposing step, the semiconductor element is covered with the encapsulating layer that is in a B-stage state and
   in the encapsulating step, the encapsulating layer is cured to be brought into a C-stage state and the semiconductor element is encapsulated by the encapsulating layer in a C-stage state.

4. The method for producing an encapsulating layer-covered semiconductor element according to claim 1, wherein the support sheet further includes a pressure-sensitive adhesive layer that is laminated at one surface in the thickness direction of the support board.

5. The method for producing an encapsulating layer-covered semiconductor element according to claim 4, wherein in the semiconductor element peeling step, the encapsulating layer-covered semiconductor element is peeled from the support board and the pressure-sensitive adhesive layer.

6. The method for producing an encapsulating layer-covered semiconductor element according to claim 4, wherein
   after the cutting step and before the semiconductor element peeling step, a support board peeling step in which the support board is peeled from the pressure-sensitive adhesive layer is further included and
   in the semiconductor element peeling step, the encapsulating layer-covered semiconductor element is peeled from the pressure-sensitive adhesive layer.

7. The method for producing an encapsulating layer-covered semiconductor element according to claim 1, wherein
   the semiconductor element peeling step includes the steps of:
   transferring the encapsulating layer-covered semiconductor element to a stretchable support sheet that is capable of stretching in a direction perpendicular to the thickness direction and
   peeling the encapsulating layer-covered semiconductor element from the stretchable support sheet, while stretching the stretchable support sheet in the direction perpendicular to the thickness direction.

8. The method for producing an encapsulating layer-covered semiconductor element according to claim 1, wherein in the preparing step, the support sheet is prepared so that a reference mark, which serves as a reference of cutting in the cutting step, is provided in advance.

9. The method for producing an encapsulating layer-covered semiconductor element according to claim 1, wherein the semiconductor element is an LED.

10. The method for producing an encapsulating layer-covered semiconductor element according to claim 1, wherein the encapsulating layer includes
a cover portion that covers the semiconductor element and
a reflector portion that contains a light reflecting component and is formed so as to surround the cover portion.

11. An encapsulating layer-covered semiconductor element obtained by a method for producing an encapsulating layer-covered semiconductor element comprising:
a preparing step of preparing a support sheet including a hard support board;
a semiconductor element disposing step of disposing a semiconductor element at one side in a thickness direction of the support sheet;
a layer disposing step of, after the semiconductor element disposing step, disposing an encapsulating layer containing a phosphor layer formed from a phosphor resin composition containing a curable resin and a phosphor at the one side in the thickness direction of the support sheet so as to cover the semiconductor element;
an encapsulating step of curing the encapsulating layer to encapsulate the semiconductor element by the encapsulating layer that is flexible;
a cutting step of, after the encapsulating step, cutting the encapsulating layer that is flexible corresponding to the semiconductor element to produce an encapsulating layer-covered semiconductor element including the semiconductor element and the encapsulating layer covering the semiconductor element; and
a semiconductor element peeling step of, after the cutting step, peeling the encapsulating layer-covered semiconductor element from the support sheet.

12. A semiconductor device comprising:
a board and
an encapsulating layer-covered semiconductor element mounted on the board, wherein
the encapsulating layer-covered semiconductor element is obtained by a method for producing an encapsulating layer-covered semiconductor element comprising:
a preparing step of preparing a support sheet including a hard support board;
a semiconductor element disposing step of disposing a semiconductor element at one side in a thickness direction of the support sheet;
a layer disposing step of, after the semiconductor element disposing step, disposing an encapsulating layer containing a phosphor layer formed from a phosphor resin composition containing a curable resin and a phosphor at the one side in the thickness direction of the support sheet so as to cover the semiconductor element;
an encapsulating step of curing the encapsulating layer to encapsulate the semiconductor element by the encapsulating layer that is flexible;
a cutting step of, after the encapsulating step, cutting the encapsulating layer that is flexible corresponding to the semiconductor element to produce an encapsulating layer-covered semiconductor element including the semiconductor element and the encapsulating layer covering the semiconductor element; and
a semiconductor element peeling step of, after the cutting step, peeling the encapsulating layer-covered semiconductor element from the support sheet.

\* \* \* \* \*